United States Patent
Sakui et al.

(10) Patent No.: US 12,048,140 B2
(45) Date of Patent: Jul. 23, 2024

(54) MEMORY DEVICE USING SEMICONDUCTOR ELEMENT

(71) Applicant: Unisantis Electronics Singapore Pte. Ltd., Singapore (SG)

(72) Inventors: Koji Sakui, Tokyo (JP); Nozomu Harada, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 253 days.

(21) Appl. No.: 17/872,310

(22) Filed: Jul. 25, 2022

(65) Prior Publication Data

US 2022/0367474 A1   Nov. 17, 2022

Related U.S. Application Data

(63) Continuation-in-part of application No. 17/478,282, filed on Sep. 17, 2021, now Pat. No. 11,776,620, (Continued)

(30) Foreign Application Priority Data

Jul. 26, 2021   (WO) .................. PCT/JP2021/027504

(51) Int. Cl.
  *G11C 11/4096*   (2006.01)
  *G11C 11/404*    (2006.01)
  (Continued)

(52) U.S. Cl.
  CPC ............ *H10B 12/20* (2023.02); *G11C 11/404* (2013.01); *G11C 11/4091* (2013.01); *G11C 11/4096* (2013.01)

(58) Field of Classification Search
  CPC . G11C 11/4096; G11C 11/404; G11C 11/406; G11C 11/4076; G11C 11/4091; H10B 12/50; H10B 12/00; H01L 29/66666
  (Continued)

(56) References Cited

U.S. PATENT DOCUMENTS

2003/0111681 A1   6/2003   Kawanaka
2006/0049444 A1   3/2006   Shino
(Continued)

FOREIGN PATENT DOCUMENTS

JP   02-188966 A   7/1990
JP   03-171768 A   7/1991
(Continued)

OTHER PUBLICATIONS

Hiroshi Takata, Kazumasa Sunouchi, Naoko Okabe, Akihiro Nitayama, Katsuhiko Hieda, Furnia Horiguchi, and Fujio Masuoka: IEEE Transaction on Electron Devices, vol. 38, No. 3, pp. 573-578 (1991).
(Continued)

*Primary Examiner* — Michael T Tran
(74) *Attorney, Agent, or Firm* — Crowell & Moring LLP

(57) ABSTRACT

In a memory device, pages are arrayed in a column direction on a substrate, each page constituted by memory cells arrayed in row direction on a substrate. Each memory cell includes a zonal P layer. $N^+$ layers continuous with a source line and a bit line respectively are on both sides of the P layer. Gate insulating layers surround part of the P layer continuous with the $N^+$ layer and part of the P layer continuous with the $N^+$ layer, respectively. One side surface of the gate insulating layer is covered with a gate conductor layer continuous with a first plate line, and the other side surface is covered with a gate conductor layer continuous
(Continued)

with a second plate line. A gate conductor layer continuous with a word line surrounds the gate insulating layer.

6 Claims, 16 Drawing Sheets

Related U.S. Application Data which is a continuation of application No. PCT/JP2020/048952, filed on Dec. 25, 2020.

(51) Int. Cl.
  *G11C 11/4091* (2006.01)
  *H10B 12/00* (2023.01)

(58) Field of Classification Search
  USPC .................................. 365/189.011, 230.05
  See application file for complete search history.

(56) References Cited

U.S. PATENT DOCUMENTS

| | | | |
|---|---|---|---|
| 2008/0137394 A1 | 6/2008 | Shimano et al. | |
| 2008/0212366 A1 | 9/2008 | Ohsawa | |
| 2009/0180342 A1* | 7/2009 | Higashi | G11C 11/406 365/205 |
| 2024/0090217 A1* | 3/2024 | Nabesaka | H10B 43/20 |
| 2024/0094795 A1* | 3/2024 | Kapinos | G06F 1/3215 |
| 2024/0099155 A1* | 3/2024 | Koike | H10N 50/80 |
| 2024/0121960 A1* | 4/2024 | Rajashekhar | H10B 41/35 |
| 2024/0130137 A1* | 4/2024 | Sondhi | H10B 51/10 |

FOREIGN PATENT DOCUMENTS

| | | | |
|---|---|---|---|
| JP | 2006-080280 A | 3/2006 | |
| JP | 395777 4 B2 | 8/2007 | |
| JP | 2008-218556 A | 9/2008 | |

OTHER PUBLICATIONS

H. Chung, H. Kim, H. Kim, K. Kim, S. Kim, K. Song, J. Kim, Y.C. Oh, Y. Hwang, H. Hong, G. Jin, and C. Chung: "Novel 4F2 DRAM Cell with Vertical Pillar Transistor(VPT)," 2011 Proceeding of the European Solid-State Device Research Conference, (2011).
H. S. Philip Wong, S. Raoux, S. Kim, Jiale Liang, J. P. Reifenberg, B. Rajendran, M. Asheghi and K. E. Goodson: "Phase Change Memory," Proceeding of IEEE, vol. 98, No. 12, Dec. oo.2201-2227 (2010).
K. Tsunoda, K .Kinoshita, H. Noshiro, Y. Yamazaki, T. Iizuka, Y. Ito, A. Takahashi, A. Okano, Y. Sato, T. Fukano, M. Aoki, and Y. Sugiyama : "Low Power and high Speed Switching of Ti-doped NiO ReRAM under the Unipolar Voltage Source of less than 3V," IEDM (2007).
W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, pp. 1-9 (2015).
M. G. Ertosun, K. Lim, C. Park, J. Oh, P. Kirsch, and K. C. Saraswat: "Novel Capacitorless Single-Transistor Charge-Trap DRAM (1 T CT DRAM) Utilizing Electrons," IEEE Electron Device Letter, vol. 31, No. 5, oo.405-407 (2010).
J. Wan, L. Royer, A. Zaslavsky, and S. Cristoloveanu: "A Compact Capacitor—Less High-Speed DRAM Using Field Effect—Controlled Charge Regeneration," Electron Device Letters, vol. 33, No. 2, oo.179-181 (2012).
T. Ohsawa, K. Fujita, T. Higashi, Y. Iwata, T. Kajiyama, Y. Asao, and K. Sunouchi: "Memory design using a one-transistor gain cell on SOI," IEEE JSSC, vol. 37, No. 11, pp. 1510-1522 (2002).
T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32nm Node and Beyond," IEEE IEDM (2006).
E. Yoshida, T. Tanaka: "A Design of a Capacitorless 1T-DRAM Cell Using Gateinduced Drain Leakage (GIDL) Current for Low-power and High-speed Embedded Memory," IEEE IEDM (2003).
J. Y. Song, W. Y. Choi, J. H. Park, J. D. Lee, and B-G. Park: "Design Optimization of Gate-All-Around (GAA) MOSFETs," IEEE Trans. Electron Devices, vol. 5, No. 3, pp. 186-191, May 2006.
N. Lou bet, et al.: "Stacked Nanosheet Gate-All-Around Transistor to Enable Scaling Beyond FinFET," 2017 IEEE Symposium on VLSI Technology Digest of Technical Papers, T17-5, T230-T231, Jun. 2017.
H. Jiang, N. Xu, B. Chen, L. Zeng, Y. He, G. Du, X. Liu and X. Zhang: "Experimental investigation of self heating effect (SHE) in multiple-fin SOI FinFETs," Semicond. Sci. Technol. 29 (2014) 115021 (7PP).
E. Yoshida, and T. Tanaka: "A Capacitorless 1T-DRAM Technology Using Gate-Induced Drain-Leakage (GIDL) Current for Low-Power and High-Speed Embedded Memory," IEEE Transactions on Electron Devices, vol. 53, No. 4, pp. 692-697,Apr. 2006.
International Search Report, Written Opinion, in Application No. PCT/JP2020/048952, dated Feb. 24, 2021, 8 pages.
F. Morishita, H. Noda, I. Hayashi, T. Gyohten, M. Oksmoto, T. Ipposhi, S. Maegawa, K. Dosaka, and K. Arimoto: "Capacitorless Twin-Transistor Random Access Memory (TTRAM) on SOI," IEICE Trans. Electron., vol. E90-c., No. 4 pp. 765-771 (Apr. 2007), 7 pages.
International Preliminary Report on Patentability and Written Opinion of the International Searching Authority in PCT/JP2021/027504, dated Feb. 8, 2024 (5 pages).

* cited by examiner

FIG. 2A "1" WRITING STATE

FIG. 2B "0" ERASING STATE

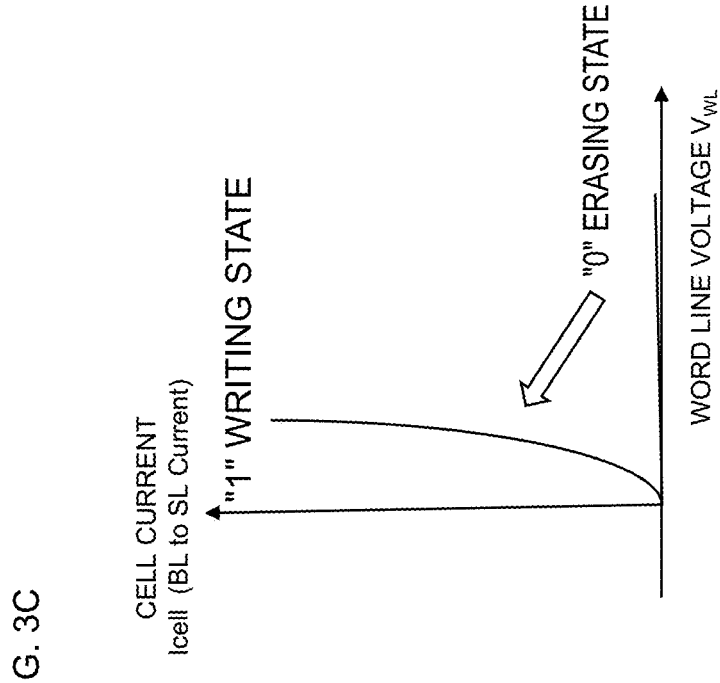
FIG. 3C
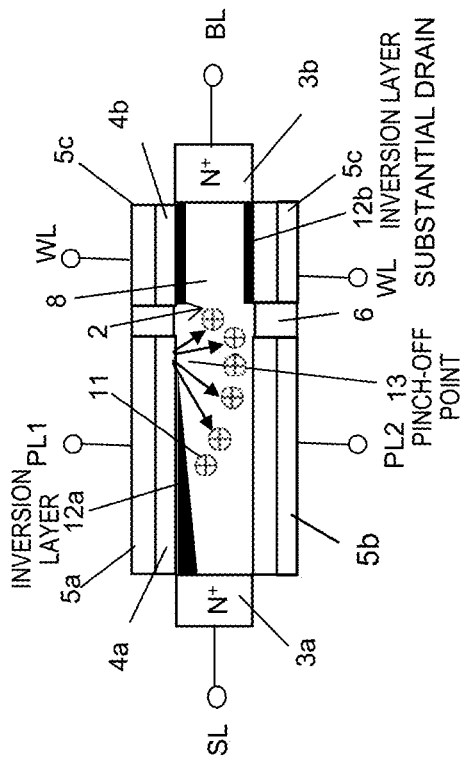
FIG. 3A  "1" WRITING OPERATION
SOURCE-SIDE IMPACT IONIZATION
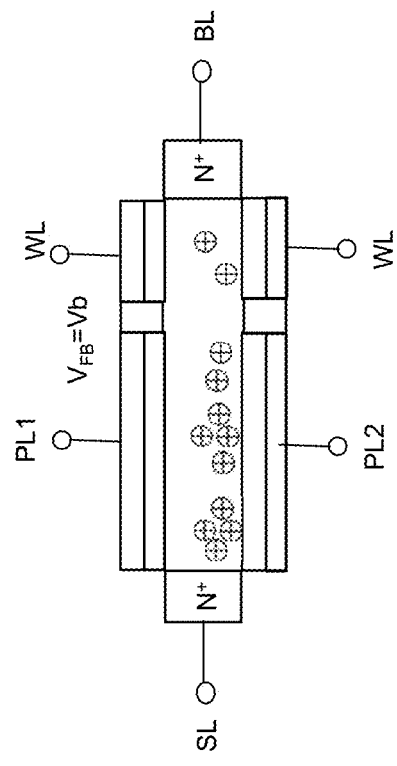
FIG. 3B  "1" WRITING STATE FIG. 4A  "1" READING
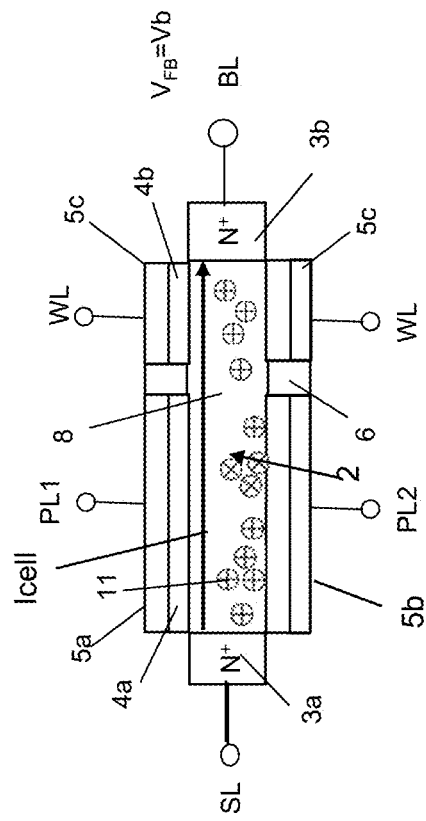
FIG. 4B  "0" READING
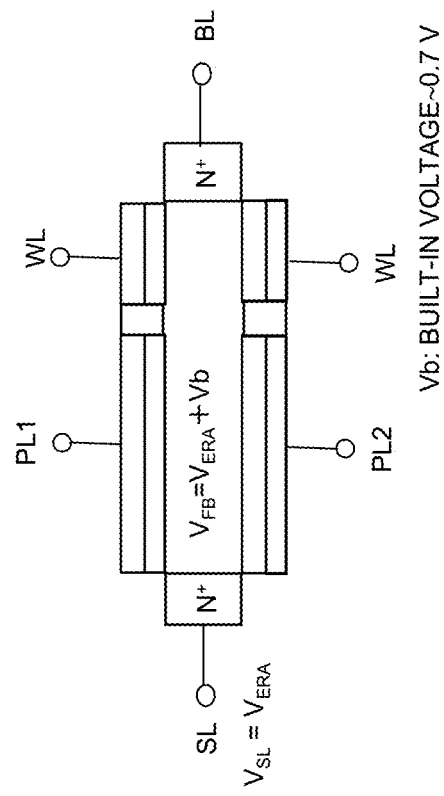
FIG. 4C
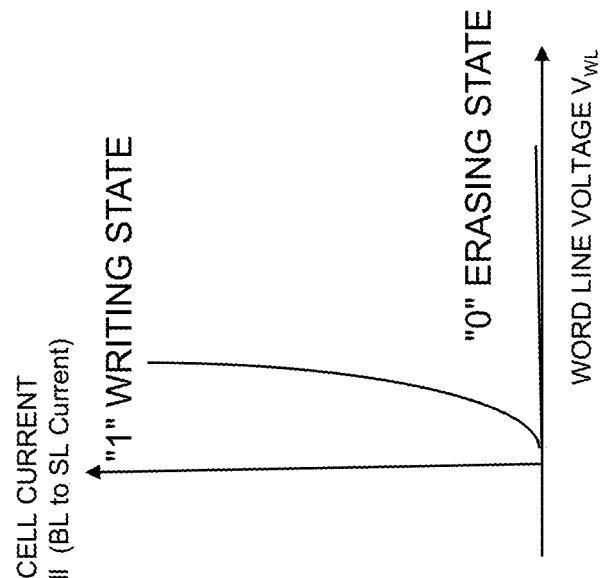

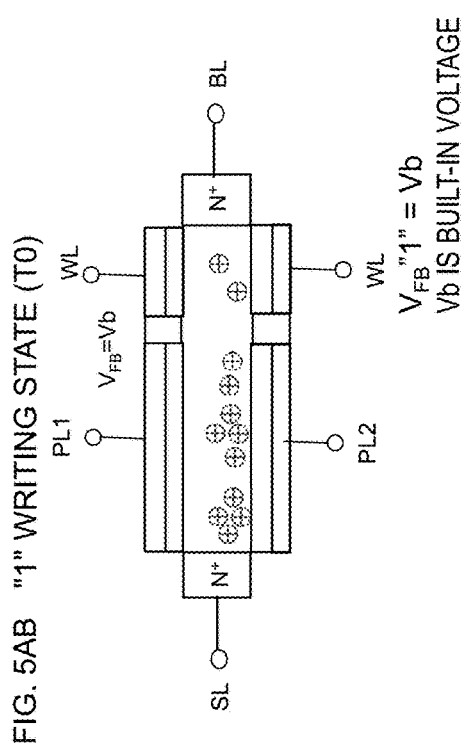

FIG. 5AA "0" PAGE ERASING OPERATION TIMING CHART

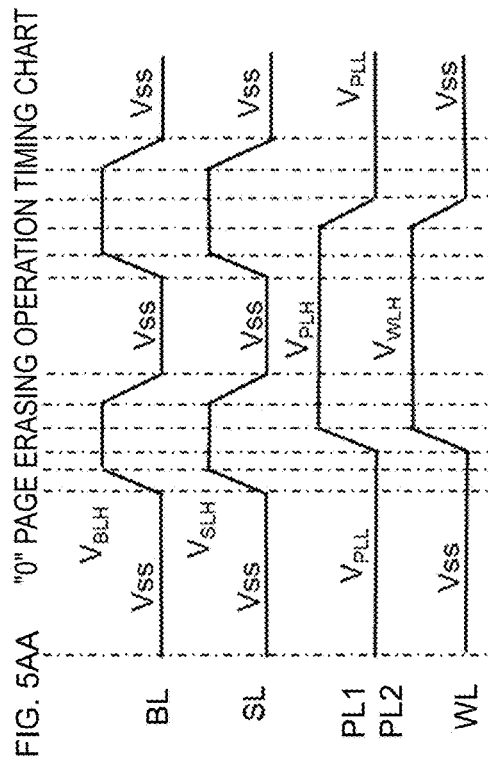

FIG. 5AB "1" WRITING STATE (T0)

$V_{FB}\text{"1"} = Vb$
Vb IS BUILT-IN VOLTAGE

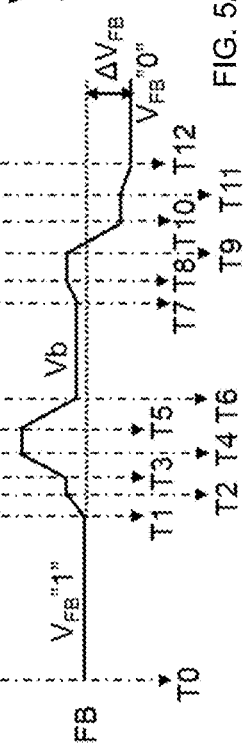

FIG. 5AC
POSITIVE HOLE GROUP 11 IS EXHAUSTED IN "0" ERASING OPERATION (T5-T6)

$$V_{FB}\text{"1"} = Vb - \beta_{WL} \times Vt_{WL}\text{"1"} - \beta_{BL} \times V_{BLH} \quad (4)$$

$$V_{FB}\text{"0"} = Vb - \beta_{WL} \times V_{WLH} - \beta_{PL} \times (V_{PLH} - V_{PLL}) \quad (5)$$

$$\begin{aligned}\Delta V_{FB} &= V_{FB}\text{"1"} - V_{FB}\text{"0"} \\ &= \beta_{WL} \times V_{WLH} + \beta_{PL} \times (V_{PLH} - V_{PLL}) \\ &\quad - \beta_{WL} \times Vt_{WL}\text{"1"} - \beta_{BL} \times V_{BLH} \quad (6)\end{aligned}$$

FIG. 5AD
CAPACITIVE COUPLING OF WORD LINE WL, PLATE LINES PL AND CHANNEL REGION 7 IN "0" ERASING OPERATION (T9-T10)

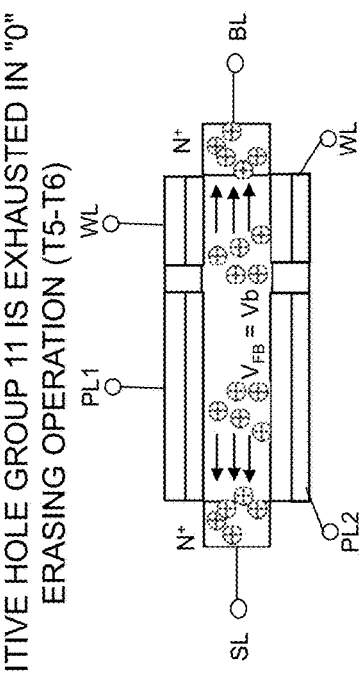

$V_{FB} = VFB\text{"0"}$

Vb: BUILT-IN VOLTAGE~0.7 V

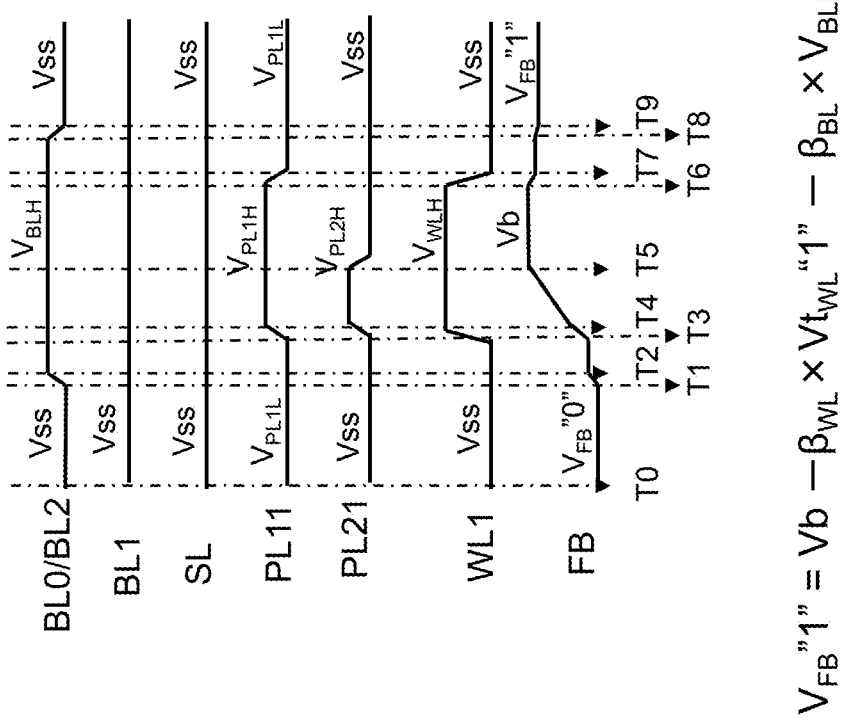

$C_{FB} = C_{WL} + C_{BL} + C_{SL}$  EXPRESSION (1)

$\Delta V_{FB} = V_{FB2} - V_{FB1}$ $= \dfrac{C_{WL}}{C_{WL} + C_{BL} + C_{SL}} \times V_{ProgWL}$   EXPRESSION (2)

$\beta = \dfrac{C_{WL}}{C_{WL} + C_{BL} + C_{SL}}$   EXPRESSION (3)

MEMORY DEVICE USING SEMICONDUCTOR ELEMENT

RELATED APPLICATIONS

The present application is a continuation-in-part application of Ser. No. 17/478,282, filed Sep. 17, 2021, which is a continuation application of PCT/JP2020/048952, filed on Dec. 25, 2020. The present application also claims priority under 35 U.S.C. § 119 to PCT/JP2021/027504, filed on Jul. 26, 2021, the entire contents of which are incorporated herein by reference.

BACKGROUND OF THE INVENTION

1. Field of the Invention

The present invention relates to a memory device using a semiconductor element.

2. Description of the Related Art

In recent years, a high integration and high performance of a memory element have been demanded in large scale integration (LSI) technology development.

Examples of memory elements including no capacitor include a phase change memory (PCM) connected with a resistance change element (see, for example, H. S. Philip Wong, S. Raoux, S. Kim, Jiale Liang, J. R. Reifenberg, B. Rajendran, M. Asheghi and K. E. Goodson: "Phase Change Memory," Proceeding of IEEE, Vol. 98, No. 12, December, pp. 2201-2227 (2010), which is incorporated herein by this reference), a resistive random access memory (RRAM) (see, for example, T. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and high Speed Switching of Ti-doped NiO ReRAM under the Unipolar Voltage Source of less than 3V," IEDM (2007), which is incorporated herein by this reference), and a magnetoresistive random access memory (MRAM) that changes resistance by changing the orientation of magnetic spin by electric current (see, for example, W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, pp. 1-9 (2015), which is incorporated herein by this reference). Each of the memory elements includes no capacitor, and therefore allows the high integration of the memory element. Further, there is a DRAM memory cell that includes no capacitor and that is constituted by one MOS transistor (see, Japanese Unexamined Patent Application Publication No. 3-171768 and M. G. Ertosum, K. Lim, C. Park, J. Oh, P. Kirsch, and K. C. Saraswat: "Novel Capacitorless Single-Transistor Charge-Trap DRAM (1T CT DRAM) Utilizing Electron," IEEE Electron Device Letter, Vol. 31, No. 5, pp. 405-407 (2010), which are incorporated herein by these references). The present application relates to a dynamic flash memory that has no resistance change element and no capacitor and that can be constituted by only the MOS transistor.

FIG. 8A to FIG. 8D show a writing operation of the above-described DRAM memory cell that includes no capacitor and that is constituted by one MOS transistor, FIG. 9A and FIG. 9B show a problem about the operation, and FIG. 10A to FIG. 10C show a reading operation (see, F. Morishita, H. Noda, I. Hayashi, T. Gyohten, M. Oksmoto, T. Ipposhi, S. Maegawa, K. Dosaka, and K. Arimoto: "Capacitorless Twin-Transistor Random Access Memory (TTRAM) on SOI," IEICE Trans. Electron., Vol. E90-c., No. 4 pp.765-771 (2007), T. Ohsawa, K. Fujita, T. Higashi, Y. Iwata, T. Kajiyama, Y. Asao, and K. Sunouchi: "Memory design using a one-transistor gain cell on SOI," IEEE JSSC, vol. 37, No. 11, pp. 1510-1522 (2002) and T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32 nm Node and Beyond," IEEE IEDM (2006), which are incorporated herein by these references).

FIG. 8A to FIG. 8D show the writing operation of the DRAM memory cell. FIG. 8A shows a "1" writing state. The memory cell is formed on an SOI substrate 100. The memory cell is constituted by a source $N^+$ layer 103 (hereinafter, a semiconductor region containing donor impurity at high concentration is referred to as an "$N^+$ layer") that is connected with a source line SL, a drain $N^+$ layer 104 that is connected with a bit line BL, a gate conducting layer 105 that is connected with a word line WL, and a floating body 102 of a MOS transistor 110a. The DRAM memory cell includes no capacitor, and the number of the MOS transistors 110a constituting the DRAM memory cell is one. A $SiO_2$ layer 101 of the SOI substrate contacts just under the floating body 102 of a P layer (hereinafter, a semiconductor region containing acceptor impurity is referred to as a "P layer"). At the time of a "1" writing of the memory cell constituted by one MOS transistor 110a, the MOS transistor 110a operates in a linear region. That is, an electron channel 107 extending from the source $N^+$ layer 103 has a pinch-off point 108, and does not reach the drain $N^+$ layer 104 connected with the bit line. Thus, when the MOS transistor 110a operates while both the bit line BL connected with the drain $N^+$ layer 104 and the word line WL connected with the gate conducting layer 105 have high voltages and the gate voltage is about ½ of the drain voltage, electric field intensity is maximized at the pinch-off point 108 near the drain $N^+$ layer 104. As a result, accelerated electrons that flow from the source $N^+$ layer 103 to the drain $N^+$ layer 104 collide with a Si lattice, and by a kinetic energy lost at this time, pairs of electrons and positive holes are generated (impact ionization phenomenon). Most of the generated electrons (not illustrated) reach the drain $N^+$ layer 104. Further, a very small number of extremely hot electrons reach the gate conducting layer 105 beyond a gate oxide film 109. Then, positive holes 106 generated at the same time charge the floating body 102. In this case, the generated positive holes contribute to the increase in many carriers, because the floating body 102 is a P-type Si. When the floating body 102 is filled with generated positive holes 106 and the voltage of the floating body 102 becomes higher than the voltage of the source $N^+$ layer 103 by Vb or more, further generated positive holes are discharged to the source $N^+$ layer 103. Vb is a built-in voltage for the PN junction between the source $N^+$ layer 103 and the floating body 102 of the P layer, and is about 0.7 V. FIG. 8B shows a circumstance where the floating body 102 is saturated and charged with generated positive holes 106.

Next, a "0" writing operation of the memory cell 110 will be described with use of FIG. 8C. A selected common word line WL randomly includes memory cells 110a for "1" writing and memory cells 110b for "0" writing. FIG. 8C shows the circumstance of the change from the "1" writing state to the "0" writing state. At the time of the "0" writing, the voltage of the bit line BL is negatively biased, and the PN junction between the drain N⁺ layer 104 and the floating body 102 of the P layer is forward biased. As a result, positive holes 106 generated in the floating body 102 at a previous cycle in advance flow to the drain N⁺ layer 104 connected with the bit line BL. When the writing operation ends, there are obtained two memory cell states: a memory cell 110a filled with generated positive holes 106 (FIG. 8B) and a memory cell 110b having expelled generated positive holes (FIG. 8C). The potential of the floating body 102 of the memory cell 110a filled with positive holes 106 is higher than the potential of the floating body 102 including no generated positive hole. Accordingly, the threshold voltage of the memory cell 110a is lower than the threshold voltage of the memory cell 110b. The circumstance is shown in FIG. 8D.

Next, the problem about the operation of the memory cell constituted by one MOS transistor will be described with use of FIG. 9A and FIG. 9B. As shown in FIG. 9A, a capacity $C_{FB}$ of the floating body 102 is the sum of a capacity $C_{WL}$ between the gate connected with the word line and the floating body 102, a junction capacity $C_{SL}$ of the PN junction between the source N⁺ layer 103 connected with the source line and the floating body 102, and a junction capacity $C_{BL}$ of the PN junction between the drain N⁺ layer 104 connected with the bit line and the floating body 102, and is expressed as follows.

$$C_{FB} = C_{WL} + C_{BL} + C_{SL} \quad (1)$$

Accordingly, when a word line voltage $V_{WL}$ has amplitude at the time of the writing, the influence acts on the voltage of the floating body 102 that is a storage node (contact point) of the memory cell. The circumstance is shown in FIG. 9B. When the word line voltage $V_{WL}$ rises from 0 V to $V_{ProgWL}$ at the time of the writing, a $V_{FB}$ of the floating body 102 rises from a voltage $V_{FB1}$ in an initial state before the change in the word line voltage to $V_{FB2}$, due to the capacitive coupling with the word line. A voltage change amount $\Delta V_{FB}$ in the floating body 102 is expressed as follows.

$$\Delta V_{FB} = V_{FB2} - V_{FB1} = C_{WL}/(C_{WL} + C_{BL} + C_{SL}) \times V_{ProgWL} \quad (2)$$

Here, β is referred to as a coupling ratio, and is expressed as follows.

$$\beta = C_{WL}/(C_{WL} + C_{BL} + C_{SL}) \quad (3)$$

In such a memory cell, the contribution ratio of $C_{WL}$ is high, and for example, $C_{WL}:C_{BL}:C_{SL}=8:1:1$ is satisfied. In this case, β=0.8 is satisfied. For example, when the voltage of the word line changes 5 V, which is the voltage at the time of the writing, to 0 V, which is the voltage after the writing, the floating body 102 receives amplitude noise at 5 V×β=4 V, due to the capacitive coupling between the word line and the floating body 102. Therefore, there is a problem in that the potential difference margin between a "1" potential and a "0" potential in the floating body at the time of the writing is insufficient.

FIG. 10A to FIG. 10C show the reading operation. FIG. 10A shows the "1" writing state, and FIG. 10B shows the "0" writing state. However, actually, even if Vb is written to the floating body 102 by the "1" writing, the voltage of the floating body 102 is reduced to a negative bias when the voltage of the word line returns to 0 V with the end of the writing. When "0" is written, the voltage of the floating body 102 becomes a further deeper negative bias. Therefore, as shown in FIG. 10C, a sufficiently large margin cannot be obtained as the potential difference margin between "1" and "0" at the time of the writing. The problem about the small operation margin is a big problem for the DRAM memory cell. In addition, a high densification of the DRAM memory cell is demanded.

SUMMARY OF THE INVENTION

In the one-transistor type DRAM (gain cell) that is a memory device using a MOS transistor and that includes no capacitor, there is a problem in that when the potential of the word line has amplitude at the time of data reading or writing, the potential is transmitted directly to the MOS transistor body as noise because the capacitive coupling between the word line and the floating body is large. As a result, problems such as a wrong reading and a wrong rewriting of storage data are caused, and it is difficult to put the one-transistor type DRAM (gain cell) including no capacitor, to practical use. Further, it is necessary not only to solve the above problem, but also to increase the performance and densification of the memory cell.

For solving the above problems, a memory device using a semiconductor element according to the present invention is a memory device using a semiconductor element, the memory device including a plurality of pages arrayed in a column direction on a substrate, each of the plurality of pages being constituted by a plurality of memory cells arrayed in a row direction on the substrate, each of the plurality of memory cells included in each of the plurality of pages including: a first semiconductor layer that stands in a direction vertical to the substrate or extends in a direction horizontal to the substrate, on the substrate; a first impurity layer and a second impurity layer that are provided at both ends of the first semiconductor layer in a first direction parallel to the substrate; a first gate insulating layer that covers both side surfaces of the first semiconductor layer close to the first impurity layer in a second direction parallel to the substrate and vertical to the first direction; a first gate conductor layer and a second gate conductor layer that cover both side surfaces of the first gate insulating layer in planar view and that are separated from each other; a second gate insulating layer that covers the first semiconductor layer close to the second impurity layer; and a third gate conductor layer that covers the second gate insulating layer, voltages that are applied to the first gate conductor layer, the second gate conductor layer, the third gate conductor layer, the first impurity layer and the second impurity layer being controlled to hold a positive hole group generated by an impact ionization phenomenon, in the interior of the first semiconductor layer, at the time of a page writing operation, the voltage of a channel semiconductor layer being set to a first data holding voltage higher than either or both of the first impurity layer and the second impurity layer, at the time of a page erasing operation, the voltages that are applied to the first gate conductor layer, the second gate conductor layer, the third gate conductor layer, the first impurity layer and the second impurity layer being controlled to remove the positive hole group from either or both of the first impurity layer and the second impurity layer and set the voltage of the first semiconductor layer to a second data holding voltage lower than the first holding voltage, the first impurity layer of each of the plurality of memory cells being connected with a source line, the second impurity layer being connected with a bit line, the first gate conductor layer being connected with a first plate line, the second gate conductor layer being connected with a second plate line, the third gate conductor layer being connected with a word line, the bit line being connected with a sense amplifier circuit, at the time of a page reading operation, voltages that are applied to the word line, the first plate line, the second plate line, the source line and the bit line being controlled to cause the sense amplifier circuit to read page data in a memory cell group selected by the word line, in either or both of the page writing operation and the page reading operation, a positively-biased pulse voltage equal to or lower than the voltage of the first plate line being input to the second plate line (first invention).

As a second invention, in the above first invention, at the time of the page erasing operation, an identical pulse voltage, or a fixed voltage lower than that for the first plate line is input to the first plate line and the second plate line (second invention).

As a third invention, in the above first invention, at the time of the page reading operation, a fixed voltage higher than the positively-biased pulse voltage for the second plate line is input to the first plate line (third invention).

As a fourth invention, in the above first invention, at either or both of the time of the page writing operation and the time of the page reading operation, the width of the positively-biased pulse voltage for the second plate line is shorter than the width of a pulse voltage for the word line (fourth invention).

As a fifth invention, in the above first invention, the third gate conductor layer is constituted by at least two gate conductor layers, each of which is operated synchronously or asynchronously (fifth invention).

As a sixth invention, in the above first invention, either of a first gate capacity between the first gate conductor layer and the first semiconductor layer and a second gate capacity between the second gate conductor layer and the first semiconductor layer, or the total gate capacity of both of the first gate capacity and the second gate capacity is larger than a third gate capacity between the third gate conductor layer and the first semiconductor layer (sixth invention).

BRIEF DESCRIPTION OF THE DRAWINGS

FIGS. 2A, 2B and 2C are diagrams for describing an erasing operation mechanism of the memory device according to the first embodiment.

FIGS. 3A, 3B and 3C are diagrams for describing a writing operation mechanism of the memory device according to the first embodiment.

FIGS. 4A, 4B and 4C are diagrams for describing a reading operation mechanism of the memory device according to the first embodiment.

FIGS. 5AA, 5AB, 5AC and 5AD are diagrams for describing a mechanism of a positive hole push-up erasing operation in which a page erasing operation is performed by only a positively-biased applied voltage according to the first embodiment.

FIG. 7C is an operation waveform chart for describing the improvement of the writing operation and reading operation of the memory device including the SGT according to the first embodiment.

DETAILED DESCRIPTION OF THE PREFERRED EMBODIMENTS

The structure, drive scheme and production method of a memory device (referred to as a dynamic flash memory, hereinafter) using a semiconductor element according to the present invention will be described below with reference to the drawings.

First Embodiment

The structure, operation mechanism and production method of a first dynamic flash memory cell according to a first embodiment of the present invention will be described with use of FIGS. 1A-1D to FIGS. 4A-4C. The structure of the first dynamic flash memory cell will be described with use of FIG. 1A to FIG. 1D. Further, a data erasing mechanism will be described with use of FIG. 2A to FIG. 2C, a data writing mechanism will be described with use of FIG. 3A to FIG. 3C, and a data reading mechanism will be described with use of FIG. 4A to FIG. 4C.

Figure 1C:
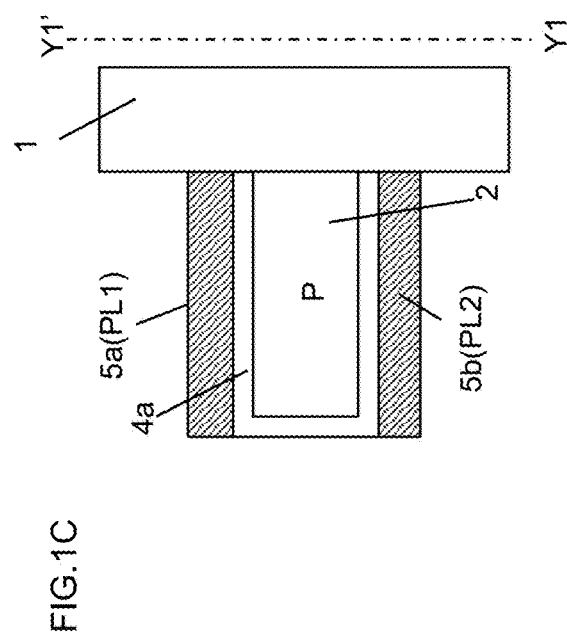
FIGS. 1A, 1B, 1C and 1D are structural diagrams of a memory device according to a first embodiment.
Figure 1D:
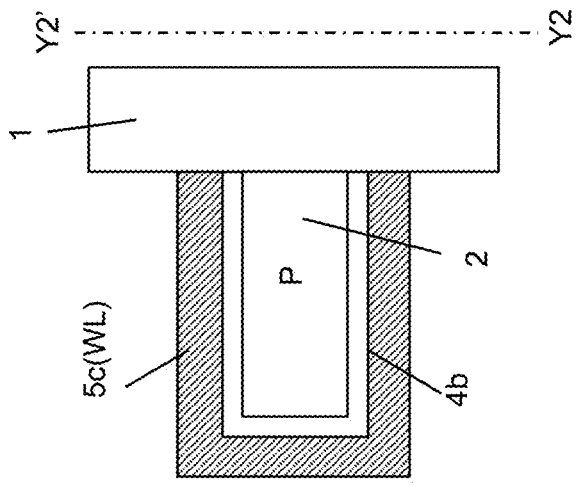
Figure 1A:
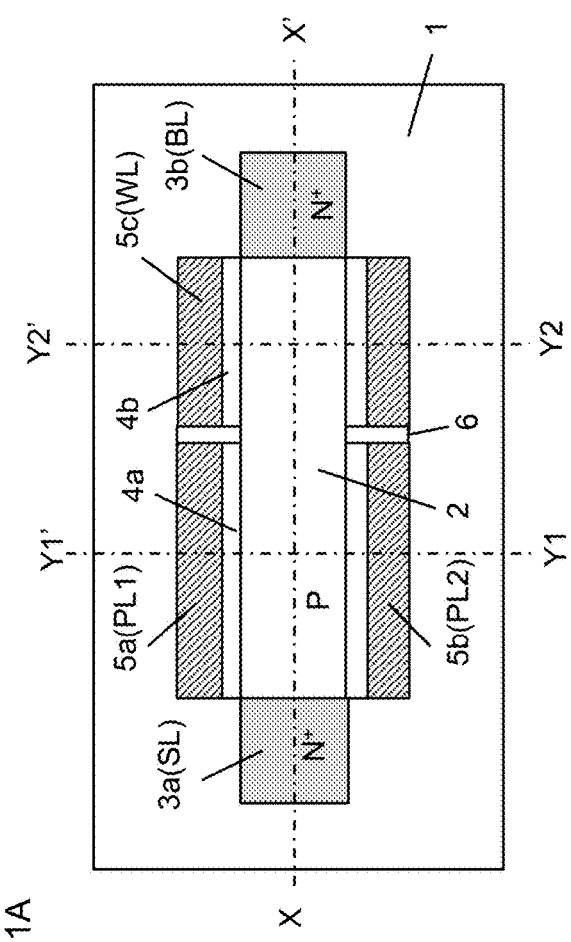
Figure 1B:
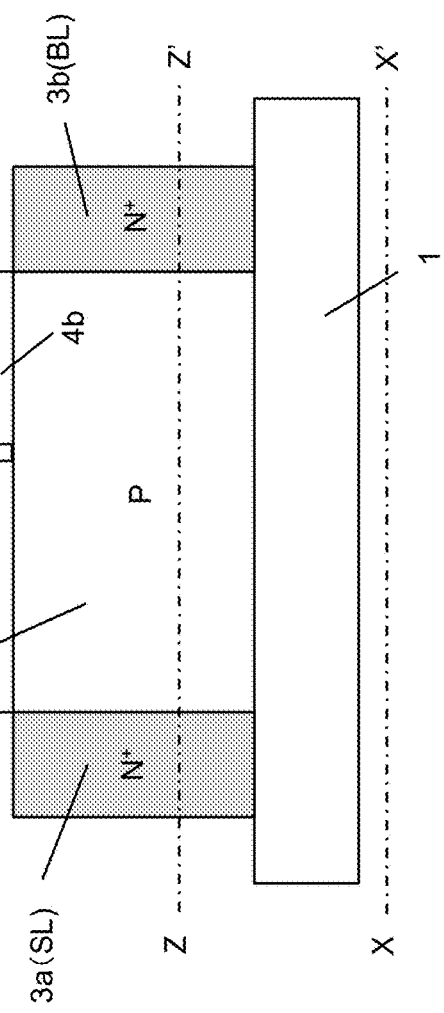

FIG. 1A to FIG. 1D show the structure of the first dynamic flash memory cell according to the first embodiment of the present invention. FIG. 1A is a horizontal sectional view taken along line Z-Z' in FIG. 1B. FIG. 1B is a vertical sectional view taken along line X-X' in FIG. 1A. FIG. 1C is a vertical sectional view taken along line Y-Y1' in FIG. 1A. FIG. 1D is a vertical sectional view taken along line Y2-Y2' in FIG. 1A.

A zonal P layer 2 (an example of the "first semiconductor layer" in the claims) is on a substrate 1 (an example of the "substrate" in the claims). Further, an N$^+$ layer 3a (an example of the "first impurity layer" in the claims) and an N$^+$ layer 3b (an example of the "second impurity layer" in the claims) are on both sides of the P layer 2 in an X-X' direction. A first gate insulating layer 4a (an example of the "first gate insulating layer" in the claims) is provided so as to surround the P layer 2 that is continuous with the N⁺ layer 3a, and a second gate insulating layer 4b (an example of the "second gate insulating layer" in the claims) is provided so as to surround the P layer 2 that is continuous with the N⁺ layer 3b. Further, there are a first gate conductor layer 5a (an example of the "first gate conductor layer" in the claims) and a second gate conductor layer 5b (an example of the "second gate conductor layer" in the claims) that cover two side surfaces of the first gate insulating layer 4a in a Y1-Y1' direction respectively and that are separated from each other. Further, a third gate conductor layer 5c (an example of the "third gate conductor layer" in the claims) is provided so as to surround the second gate insulating layer 4b. Further, the first gate conductor layer 5a, the second gate conductor layer 5b and the third gate conductor layer 5c are separated by an insulating layer 6. Thereby, a dynamic flash memory cell constituted by the N⁺ layers 3a, 3b, the P layer 2, the first gate insulating layer 4a, the second gate insulating layer 4b, the first gate conductor layer 5a, the second gate conductor layer 5b and the third gate conductor layer 5c is formed.

As shown in FIG. 1A to FIG. 1D, the N⁺ layer 3a is connected with a source line SL (an example of the "source line" in the claims), the N⁺ layer 3b is connected with a bit line BL (an example of the "bit line" in the claims), the first gate conductor layer 5a is connected with a first plate line PL1 (an example of the "first plate line" in the claims), the second gate conductor layer 5b is connected with a second plate line PL2 (an example of the "second plate line" in the claims), and the third gate conductor layer 5c is connected with a word line WL (an example of the "word line" in the claims).

Figure 2C:
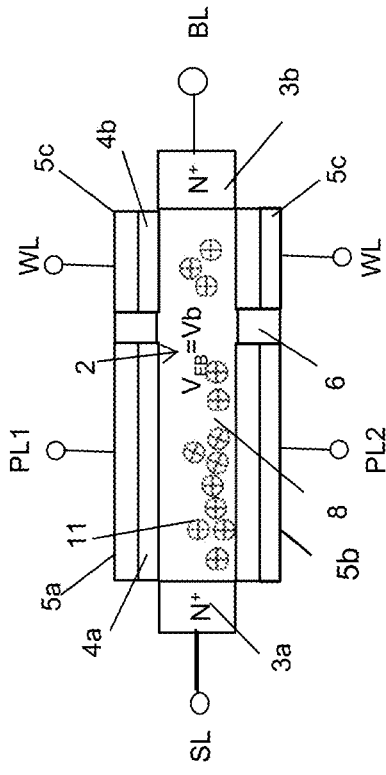
Figure 2C:
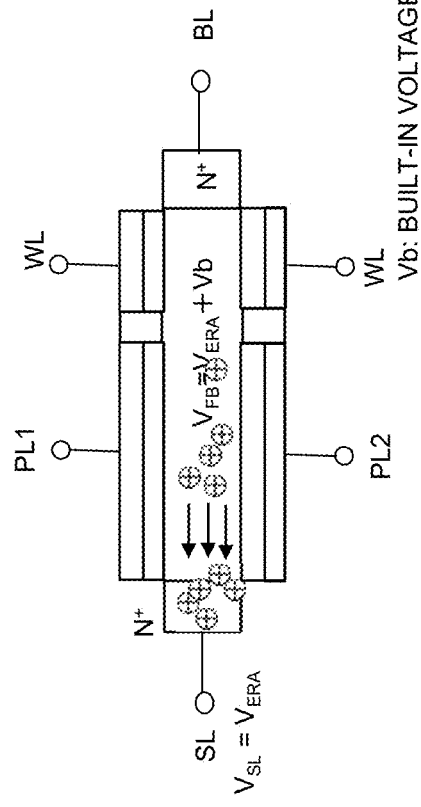
Figure 2C:
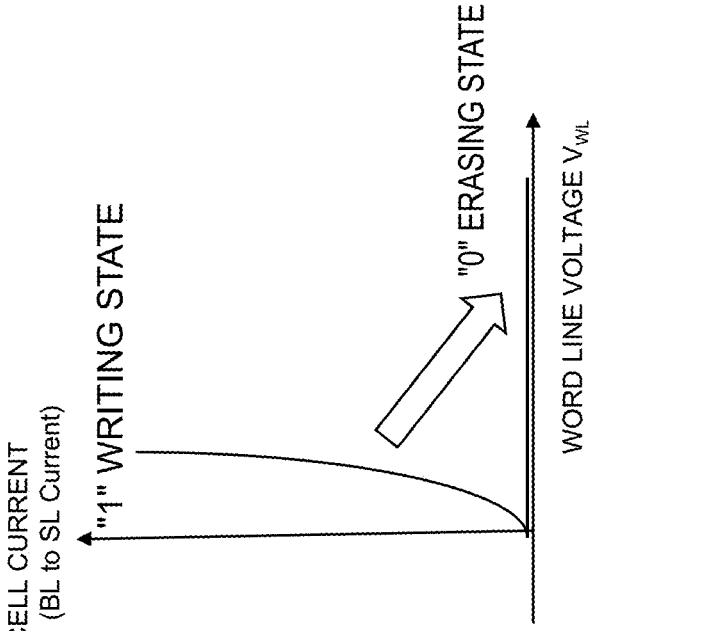

An erasing operation mechanism will be described with use of FIG. 2A to FIG. 2C. FIG. 2A shows a state where a positive hole group 11 generated at a previous cycle by impact ionization is accumulated in a channel region 8 of the P layer 2 before the erasing operation. The channel region 8 between the N⁺ layers 3a, 3b is electrically separated from the insulating substrate 1, and is a floating body. A voltage lower than that for the first plate line PL1 is applied to the second plate line PL2. Thereby, the positive hole group 11 is accumulated mainly in the P layer 2 close to the second gate conductor layer 5b connected with the second plate line PL2. Some of the positive hole group 11 is accumulated also in the channel region 8 surrounded by the third gate conductor layer 5C. As shown in FIG. 2B, at the time of the erasing operation, the voltage of the source line SL is set to a negative voltage $V_{ERA}$. For example, $V_{ERA}$ is −3 V. As a result, the PN junction between the N⁺ layer 3a as a source connected with the source line SL and the channel region 8 has a forward bias, regardless of the value of the initial potential of the channel region 8. As a result, the positive hole group 11 generated at the previous cycle by impact ionization and accumulated in the channel region 8 is absorbed into the N⁺ layer 3a of the source portion, and a potential $V_{FB}$ of the channel region 8 becomes $V_{FB}=V_{ERA}+Vb$. Vb is a built-in voltage for the PN junction, and is about 0.7 V. Accordingly, in the case of $V_{ERA}=-3$ V, the potential of the channel region 8 is −2.3 V. This value is the potential of the channel region 8 in the erasing state. Therefore, when the potential of the channel region 8 of the floating body becomes a negative voltage, the threshold voltage of an N channel MOS transistor of the dynamic flash memory cell becomes high by a substrate bias effect. Thereby, as shown in FIG. 2C, the threshold voltage of the third gate conductor layer 5c connected with the word line WL becomes high. In the erasing state of the channel region 8, logic storage data is "0". In data reading, the voltage to be applied to the first gate conductor layer 5a that is continuous with the first plate line PL1 is set to a voltage that is higher than a threshold voltage when the logic storage data is "1" and that is lower than a threshold voltage when the logic storage data is "0", and the voltage to be applied to the second gate conductor layer 5b that is continuous with the second plate line PL2 is set to 0 V, for example. Thereby, it is possible to obtain a characteristic by which electric current does not flow even if the voltage of the word line WL is high, as shown in FIG. 2C. The condition of the voltages to be applied to the bit line BL, the source line SL, the word line WL, the first plate line PL1 and the second plate line PL2 and the potential of the floating body are examples for performing the erasing operation, and another operation condition allowing the erasing operation may be adopted.

FIG. 3A to FIG. 3C show a page writing operation (an example of the "page writing operation" in the claims) of the dynamic flash memory cell. As shown in FIG. 3A, for example, 0 V is input to the N⁺ layer 3a connected with the source line SL, for example, 3 V is input to the N⁺ layer 3b connected with the bit line BL, for example, 2 V is input to the first gate conductor layer 5a connected with the first plate line PL1, for example, 0 V is input to the second gate conductor layer 5b connected with the second plate line PL2, and for example, 5 V is input to the third gate conductor layer 5c connected with the word line WL. As a result, as shown in FIG. 3A, an inversion layer 12a is formed in the channel region 8 on the inside of the first gate conductor layer 5a connected with the first plate line PL1, and the operation is performed while a first N channel MOS transistor region including the first gate conductor layer 5a is a saturation region. As a result, a pinch-off point 13 is in the inversion layer 12a on the inside of the first gate conductor layer 5a connected with the first plate line PL1. On the other hand, a second N channel MOS transistor region including the third gate conductor layer 5c connected with the word line WL operates in a linear region. As a result, no pinch-off point is in the channel region 8 on the inside of the third gate conductor layer 5c connected with the word line WL, and an inversion layer 12b is formed over the whole surface. The inversion layer 12b formed over the whole surface on the inside of the third gate conductor layer 5c connected with the word line WL serves as a substantial drain for the first N channel MOS transistor region including the first gate conductor layer 5a. As a result, the electric field is maximized in a first border region of the channel region 8 between the first N channel MOS transistor region including the first gate conductor layer 5a and the second N channel MOS transistor region including the third gate conductor layer 5c, which are connected in series, and an impact ionization phenomenon occurs in the border region. The border region is a source-side region relative to the second N channel MOS transistor region including the third gate conductor layer 5c connected with the word line WL, and therefore, the phenomenon is referred to as a source-side impact ionization phenomenon. By the source-side impact ionization phenomenon, electrons flow from the N⁺ layer 3a connected with the source line SL to the N⁺ layer 3b connected with the bit line BL. Accelerated electrons collide with lattice Si atoms, and by the kinetic energy, pairs of electrons and positive holes are generated. Some of the generated electrons flow to the first gate conductor layer 5a and the third gate conductor layer 5c, but most of the generated electrons flow to the N⁺ layer 3b connected with the bit line BL.

During the writing operation of the dynamic flash memory cell, for example, 0 V is input to the second gate conductor layer 5b connected with the second plate line PL2.

Accordingly, the inversion layer 12a is not formed in the region 8 on the inside of the second gate conductor layer 5b connected with the second plate line PL2. Thereby, the positive hole group 11 formed by the impact ionization phenomenon is mainly accumulated in the P layer 2 close to the second gate conductor layer 5b connected with the second plate line PL2.

Further, in the "1" writing, pairs of electrons and positive holes may be generated using a gate induced drain leakage (GIDL) current, and a floating body FB may be filled with the generated positive hole group 11 (see, for example, E. Yoshida, and T. Tanaka: "A Capacitorless 1T-DRAM Technology Using Gate-Induced Drain-Leakage (GIDL) Current for Low-Power and High-Speed Embedded Memory," IEEE Transactions on Electron Devices, Vol. 53, No. 4, pp. 692-697, Apr. 2006, which is incorporated herein by this reference).

As shown in FIG. 3B, the generated positive hole group 11 forms many carriers in the channel region 8, and charges the channel region 8 such that the channel region 8 is positively biased. Since the $N^+$ layer 3a connected with the source line SL is 0 V, the channel region 8 is charged to the built-in voltage Vb (about 0.7 V) for the PN junction between the $N^+$ layer 3a connected with the source line SL and the channel region 8. When the channel region 8 is charged so as to be positively biased, the threshold voltage of the first N channel MOS transistor region and the second N channel MOS transistor region becomes low by the substrate bias effect. Thereby, as shown in FIG. 3C, the threshold voltage of the second N channel MOS transistor region connected with the word line WL becomes low. A first data holding voltage (an example of the "first data holding voltage" in the claims) in the writing state of the channel region 8 is assigned to the logic storage data "1". The generated positive hole group 11 is mainly accumulated in the P layer 2 close to the second gate conductor layer 5b. Thereby, a stable substrate bias effect is obtained.

At the time of the writing operation, pairs of electrons and positive holes may be generated by the impact ionization phenomenon or the GIDL current, in a second border region between the $N^+$ layer 3a and the channel region 8 or a third border region between the $N^+$ layer 3b and the channel region 8, instead of the first border region, and the channel region 8 may be charged with the generated positive hole group 11. The condition of the voltages to be applied to the bit line BL, the source line SL, the word line WL, the first plate line PL1 and the second plate line PL2 is an example for performing the writing operation, and another operation condition allowing the writing operation may be adopted.

A reading operation of the dynamic flash memory cell will be described with use of FIG. 4A to FIG. 4C. When the channel region 8 is charged to the built-in voltage Vb (about 0.7 V) as shown in FIG. 4A, the threshold voltage of the N channel MOS transistor region decreases by the substrate bias effect. This state is assigned to the logic storage data "1". As shown in FIG. 4B, in the case where a memory block selected before the writing is previously in the erasing state "0", the floating voltage $V_{FB}$ of the channel region 8 is $V_{ERA}$+Vb. The writing state "1" is randomly stored by the writing operation. As a result, the logic storage data including the logic "0" and the logic "1" is created.

In the case where the storage data is the logic "0", the threshold voltage of the N channel MOS transistor region is 1.3 V, for example, and in the case where the storage data is the logic "1", the threshold voltage of the N channel MOS transistor region is 0.3 V. Accordingly, for example, 0 V is input to the $N^+$ layer 3a connected with the source line SL, for example, 0.5 V is input to the $N^+$ layer 3b connected with the bit line BL, for example, 0.8 V, which is an intermediate voltage between the logic "0" and the logic "1" in the N channel MOS transistor region, is input to the first gate conductor layer 5a connected with the first plate line PL1, and for example, 0 V is input to the second gate conductor layer 5b connected with the second plate line PL2. As a result, in the memory cell in which the storage data is the logic "1", the operation is performed while the first N channel MOS transistor region including the first gate conductor layer 5a is a linear region, and the second N channel MOS transistor region including the third gate conductor layer 5c connected with the word line WL operates in a saturation region. On the other hand, in the memory cell in which the storage data is the logic "0", the threshold voltage of the first N channel MOS transistor region including the first gate conductor layer 5a is as high as 1.3 V, for example, and therefore the conduction is not performed even if a voltage of 0.8 V is applied to the first gate conductor layer 5a connected with the first plate line PL1. Accordingly, as shown in FIG. 4C, the reading is performed by a sense amplifier circuit, using the level difference between the two threshold voltages for the first plate line PL1 and the word line WL. In the data reading, the voltage to be applied to the first gate conductor layer 5a that is continuous with the first plate line PL1 is set to a voltage that is higher than a threshold voltage when the logic storage data is "1" and that is lower than a threshold voltage when the logic storage data is "0", and the voltage to be applied to the second gate conductor layer 5b that is continuous with the second plate line PL2 is set to 0 V, for example. Thereby, it is possible to obtain a characteristic by which electric current does not flow even if the voltage of the word line WL is high, as shown in FIG. 4C.

Further, at the time of the reading operation, in the memory cell in which the storage data is the logic "1", electrons flow from the $N^+$ layer 3a connected with the source line SL to the $N^+$ layer 3b connected with the bit line BL. As a result, the source-side impact ionization phenomenon is caused similarly to the writing operation. Accordingly, in parallel with the reading operation, due to the impact ionization phenomenon, the positive hole group 11 is formed in the interior of the channel region 8 of the P layer 2 of the memory cell. Such a first refreshment operation can be performed in parallel with the reading operation, and thereby the data holding characteristic when the storage data is the logic "1" is significantly improved.

At the time of the reading operation, by setting either of a first gate capacity between the first gate conductor layer 5a and the P layer 2 and a second gate capacity between the second gate conductor layer 5b and the P layer 2 or the total gate capacity of both of the first gate capacity and the second gate capacity to a value larger than a third gate capacity between the third gate conductor layer 5c and the P layer 2, it is possible to greatly suppress the variation of the floating voltage of the channel region 8 at the time of the drive. Thereby, the reading operation of the dynamic flash memory cell with a wide operation margin is performed. The condition of the voltages to be applied to the bit line BL, the source line SL, the word line WL, the first plate line PL1 and the second plate line PL2 and the potential of the floating body are examples for performing the reading operation, and another operation condition allowing the reading operation may be adopted.

Figure 5B:
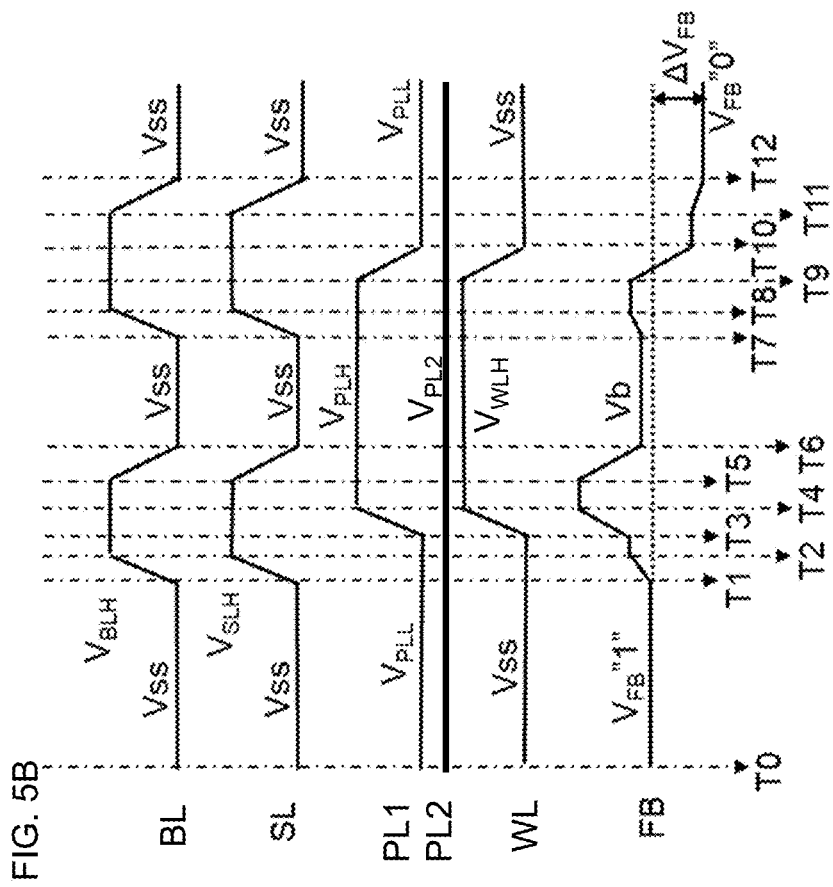
FIG. 5B is a diagram for describing the mechanism of the positive hole push-up erasing operation in which the page erasing operation is performed by only a positively-biased applied voltage according to the first embodiment.

A mechanism of a positive hole push-up erasing operation in which a page erasing operation (an example of the "page erasing operation" in the claims) is performed by only a positively-biased applied voltage without applying a negatively-biased voltage to either or both of the source line SL and the bit line BL will be described with use of FIGS. 5AA to 5AD, FIG. 5B and FIG. 6. The channel region 8 between the N⁺ layers 3a, 3b is electrically separated from the substrate, and is a floating body. FIG. 5AA shows a timing operation waveform chart for primary nodes in the erasing operation. In FIG. 5AA, T0 to T12 show times from the start of the erasing operation to the end of the erasing operation. FIG. 5AB shows a state where the positive hole group 11 generated at the previous cycle by the impact ionization is accumulated in the channel region 8 at time T0 before the erasing operation. Then, in a period of time T1 to time T2, the bit line BL and the source line SL change from the state of $V_{SS}$ to high-voltage states of $V_{BLH}$ and $V_{SLH}$, respectively. For example, $V_{SS}$ is 0 V. In this operation, in the next period of time T3 to time T4, the plate line PL1 and plate line PL2 selected in the page erasing operation change from the state of a first voltage $V_{PLL}$ to the state of a second voltage $V_{PLH}$, and the word line WL selected in the page erasing operation changes from the state of a third voltage $V_{SS}$ to a high-voltage state of a fourth voltage $V_{WLH}$. The inversion layer 12a on the inside of the first gate conductor layer 5a connected with the plate line PL1, an inversion layer 12c (not illustrated) on the inside of the third gate conductor layer 5c connected with the plate line PL2, and the inversion layer 12b on the inside of the second gate conductor layer 5b connected with the word line WL are not formed in the channel region 8. Accordingly, in the case where the threshold voltage of the second N channel MOS transistor region on the word line WL side and the threshold voltage of the first N channel MOS transistor region on the plate line PL1 side and the third N channel MOS transistor region on the plate line PL2 side are $V_{tWL}$ and $V_{tPL}$ respectively, it is desirable that the voltage $V_{BLH}$ and the voltage $V_{SLH}$ satisfy $V_{BLH} > V_{WLH} + V_{tWL}$ and $V_{SLH} > V_{PLH} + V_{tPL}$. For example, in the case where each of $V_{tWL}$ and $V_{tPL}$ is 0.5 V, $V_{WLH}$ and $V_{PLH}$ may be set to 3 V, and $V_{BLH}$ and $V_{SLH}$ may be set to 3.5 V or higher.

The description of the page erasing operation mechanism in FIG. 5AA will be continued. Since the plate lines PL1, PL2 and the word line WL becomes the high-voltage states of the second voltage $V_{PLH}$ and the fourth voltage $V_{WLH}$ in the period of time T3 to time T4, the voltage of the channel region 8 in the floating state is raised by a first capacitive coupling between the plate lines PL1, PL2 and the channel region 8 and a second capacitive coupling between the word line WL and the channel region 8. The voltage of the channel region 8 becomes a high voltage from $V_{FB}$"1" in the "1" writing state. The voltages of the bit line BL and the source line SL are high voltages $V_{BLH}$ and $V_{SLH}$, and therefore, the PN junction between the source N⁺ layer 3a and the channel region 8 and the PN junction between the drain N⁺ layer 3b and the channel region 8 are in a reverse bias state, so that the boosting can be performed.

The description of the page erasing operation mechanism in FIG. 5AA will be continued. In the next period of time T5 to time T6, the voltages of the bit line BL and the source line SL decrease from the high voltages $V_{BLH}$ and $V_{SLH}$ to $V_{SS}$. As a result, the PN junction between the source N⁺ layer 3a and the channel region 8 and the PN junction between the drain N⁺ layer 3b and the channel region 8 are in a forward bias state, as shown in FIG. 5AC, and a remaining positive hole group of the positive hole group 11 in the channel region 8 is exhausted to the source N⁺ layer 3a and the drain N⁺ layer 3b. As a result, the voltage $V_{FB}$ of the channel region 8 becomes the built-in voltage Vb for the PN junction formed by the source N⁺ layer 3a and the channel region 8 of the P layer and the PN junction formed by the drain N⁺ layer 3b and the channel region 8 of the P layer.

The description of the page erasing operation mechanism in FIG. 5AA will be continued. Next, in a period of time T7 to time T8, the voltages of the bit line BL and the source line SL rise from $V_{SS}$ to the high voltages $V_{BLH}$ and $V_{SLH}$. By this measure, as shown in FIG. 5AD, when the voltages of the plate line PL2 and the word line WL fall from the second voltage $V_{PLH}$ and the fourth voltage $V_{WLH}$ to the first voltage $V_{PLL}$ and the third voltage $V_{SS}$ respectively in a period of T9 to T10, the voltage $V_{FB}$ of the channel region 8 efficiently becomes $V_{FB}$"0" from Vb due to the first capacitive coupling between the plate lines PL1, PL2 and the channel region 8 and the second capacitive coupling between the word line WL and the channel region 8, without forming the inversion layer 12a on the plate line PL1 side, the inversion layer 12c on the plate line PL2 side and the inversion layer 12b on the word line WL side in the channel region 8. Accordingly, a voltage difference $\Delta V_{FB}$ of the channel region 8 between the "1" writing state and the "0" erasing state is expressed by the following expressions.

$$V_{FB}\text{"1"} = Vb - \beta_{WL} \times Vt_{WL}\text{"1"} - \beta_{BL} \times V_{BLH} \quad (4)$$

$$V_{FB}\text{"0"} = Vb - \beta_{WL} \times V_{WLH} - \beta_{PL} \times (V_{PLH} - V_{PLL}) \quad (5)$$

$$\Delta V_{FB} = V_{FB}\text{"1"} - V_{FB}\text{"0"} = \quad (6)$$
$$\beta_{WL} \times V_{WLH} + \beta_{PL} \times (V_{PLH} - V_{PLL}) - \beta_{WL} \times Vt_{WL}\text{"1"} - \beta_{BL} \times V_{BLH}$$

The sum of $\beta_{WL}$ and $\beta_{PL}$ is 0.8 or more. Therefore, $\Delta V_{FB}$ is large, and a sufficient margin is obtained.

The description of the page erasing operation mechanism in FIG. 5AA will be continued. Next, in a period of time T11 to time T12, the voltages of the bit line BL and the source line SL fall from $V_{BLH}$ and $V_{SLH}$ to $V_{SS}$, respectively, and the erasing operation ends. On that occasion, the bit line BL and the source line SL slightly reduce the voltage of the channel region 8 by capacitive coupling. However, the reduced amount is equivalent to an amount by which the bit line BL and the source line SL raises the voltage of the channel region 8 by capacitive coupling in the period of T7 to T8. Therefore, the raising and reducing of the voltage by the bit line BL and the source line SL are balanced, and as a result, the voltage of the channel region 8 is not influenced. The page erasing operation in which the voltage $V_{FB}$"0" of the channel region 8 in the "0" erasing state is set as a second data holding voltage (an example of the "second data holding voltage" in the claims) is performed, and the second data holding voltage is assigned to the logic storage data "0".

FIG. 5B shows an example in which a fixed voltage $V_{PL2}$ lower than that for the first plate line PL1 is applied to the second plate line PL2 at the time of the positive hole push-up erasing operation in which the page erasing operation is performed by only the positively-biased applied voltage. For example, $V_{PL2}$ may be 0 V, which is a ground potential $V_{SS}$. By giving the fixed voltage $V_{PL2}$ to the second plate line PL2 at the time of the page erasing operation in this way and giving a fixed voltage in all operation modes other than the page erasing operation, it is not necessary to connect the second plate line PL2 to a row decoder circuit RDEC and to perform decoding.

Figure 6:
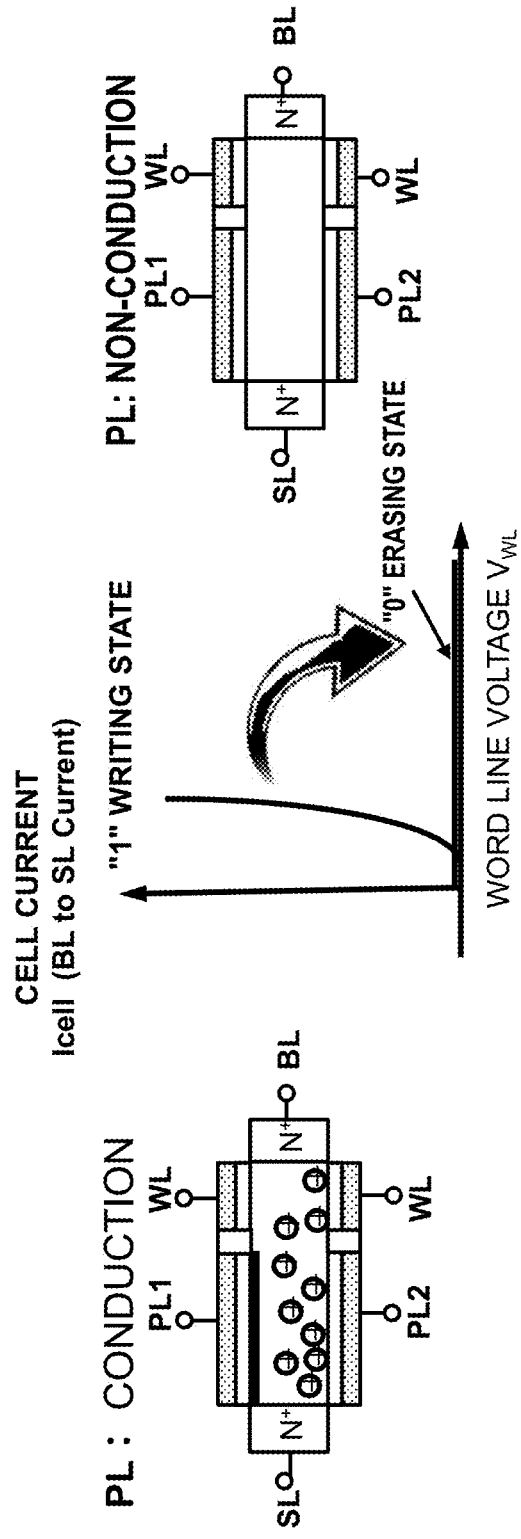
FIG. 6 is a diagram for describing a reading operation mechanism of the memory device including an SGT according to the first embodiment.

As a result, as shown in FIG. 6, a large margin is obtained in the "1" writing state and the "0" erasing state. In the "0" erasing state, the threshold voltage on the side of the plate line PL1 and the plate line PL2 is high due to the substrate bias effect. Accordingly, for example, when the applied voltages of the plate line PL1 and the plate line PL2 are the threshold voltage or lower, the first N channel MOS transistor region on the plate line PL1 side and the third N channel MOS transistor region on the plate line PL2 side are in a non-conduction state, and memory cell current does not flow. "PL: NON-CONDUCTION" on the right side in FIG. 6 shows the circumstance.

The improvement of the page writing operation and the page reading operation of the dynamic flash memory cell according to the first embodiment of the present invention will be described with use of FIG. 7A to FIG. 7F. In the page writing operation and the page reading operation, a positively-biased pulse voltage equal to or lower than the voltage of the first plate line PL1 is input to the second plate line PL2.

Figure 7A:
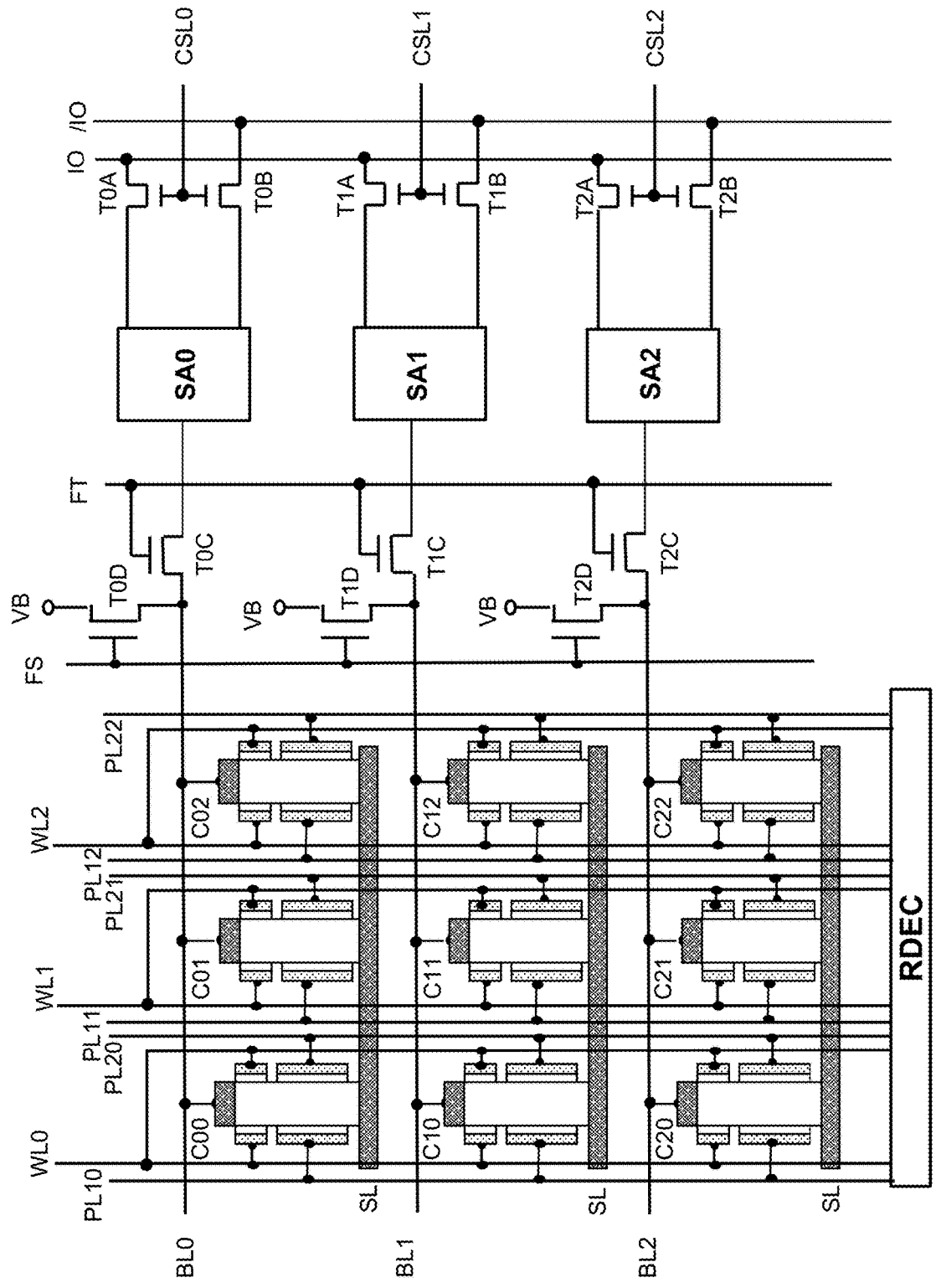
FIG. 7A is a circuit block diagram for describing the improvement of a writing operation and reading operation of the memory device including the SGT according to the first embodiment.

In FIG. 7A, memory cells C00 to C22 arranged in 3 rows×3 columns constitute a part of a memory cell block. Each of the memory cells C00 to C22 corresponds to the memory cell shown in FIG. 1A to FIG. 1D. In FIG. 7A, the memory cells C00 to C22 arranged in 3 rows×3 columns are shown, but in actual memory cell blocks, memory cells configure a row-column having a larger size than 3 rows×3 columns. Each memory cell is connected with word lines WL0 to WL2, first plate lines PL10 to PL12, second plate lines PL20 to PL22, a source line SL and bit lines BL0 to BL2. Transistors T0C to T2C each of which receives a transfer signal FT through the gate configure switch circuits. Further, the gates of transistors T0D to T2D are connected with a bit line pre-charge signal FS, the drains are connected with bit line electric power sources VB, and the sources are connected with the bit lines BL0 to BL2. The bit lines BL0 to BL2 are connected with sense amplifier circuits SA0 to SA2 (an example of the "sense amplifier circuit" in the claims) through the switch circuits. The word line WL0 to WL2, the first plate lines PL10 to PL12 and the second plate lines PL20 to PL22 are connected with the row decoder circuit RDEC. The sense amplifier circuits SA0 to SA2 are connected with a pair of complementary input-output lines IO,/IO, through transistors T0A to T2B whose gates are connected with column selection lines CSL0 to CSL2.

FIG. 7A shows a state where the erasing operation in FIG. 2B, FIGS. 5AA to 5AD or FIG. 5B has been performed to the whole of the memory cell block, and shows a circumstance where the positive hole group 11 has not been accumulated in the channel semiconductor layer 8.

Figure 7B:
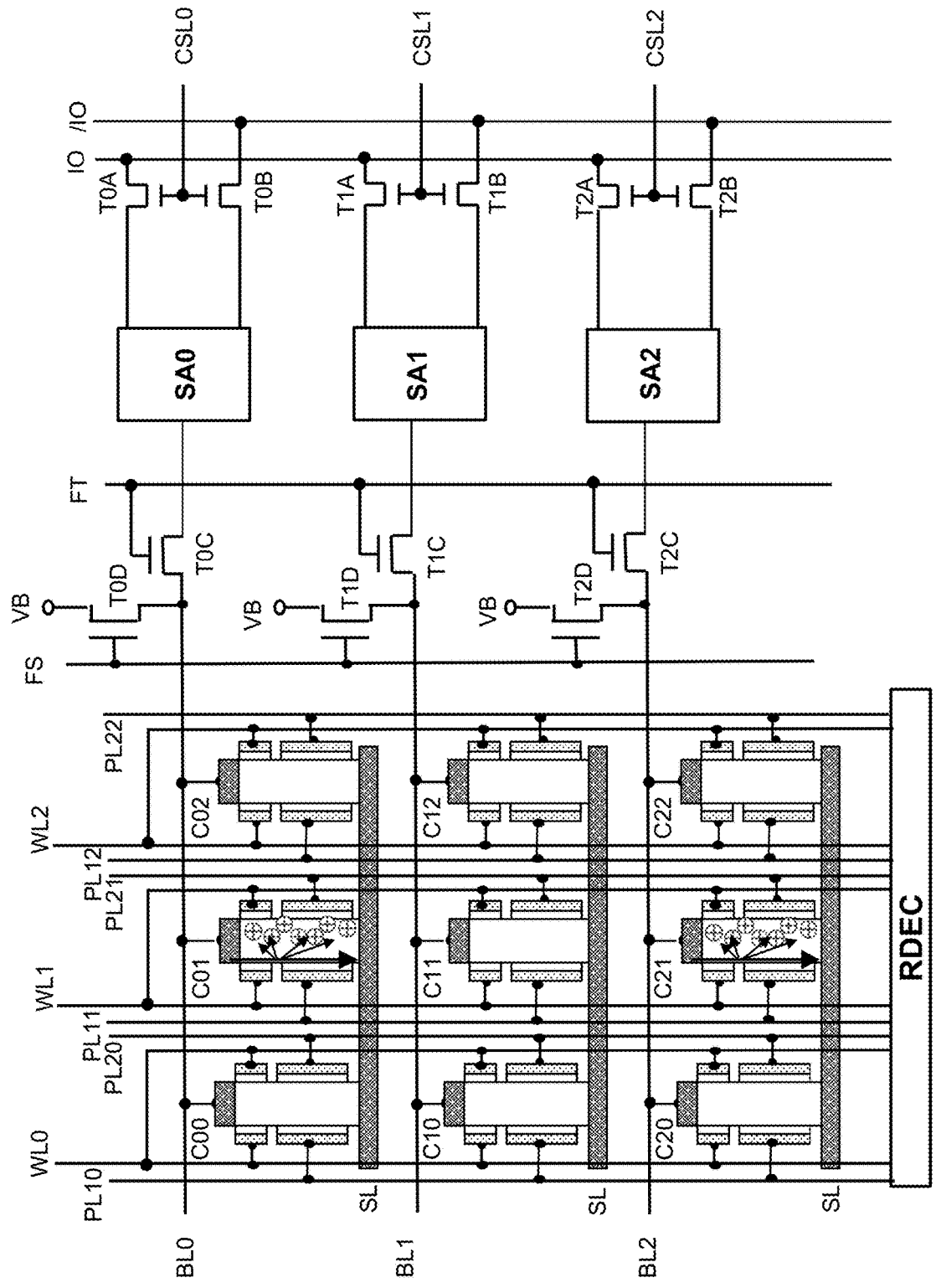
FIG. 7B is a circuit block diagram for describing the improvement of the writing operation and reading operation of the memory device including the SGT according to the first embodiment.

FIG. 7B shows a circuit block diagram in which the page writing operation is performed by the selection of the word WL1, and FIG. 7C shows an operation waveform chart for the page writing operation. Page data is written (loaded) from the input-output lines IO,/IO to the sense amplifier circuits SA0 to SA2 by the column selection lines CSL0 to CSL2. At time T0, the dynamic flash memory cell is in the "0" erasing state, and the voltage of the channel region 8 is $V_{FB}$"0". Further, $V_{SS}$ is applied to the bit lines BL0 to BL2, the source line SL and the word line WL1, $V_{PL1L}$ is applied to the first plate line PL11, and $V_{SS}$ is applied to the second plate line PL21. For example, $V_{SS}$ is 0 V, and $V_{PL1L}$ is 0.8 V. Next, in a period of time T1 to time T2, the bit lines BL0, BL2 rise from $V_{SS}$ to $V_{BLH}$, and for example, in the case where $V_{SS}$ is 0 V, the voltage of each channel region 8 of the memory cells C01, C21 becomes $V_{FB}$"0"+$\beta_{BL} \times V_{BLH}$, due to the capacitive coupling between the bit lines BL0, BL2 and the channel region 8.

Next, in a period of time T3 to time T4, the voltage of the word line WL1 rises from $V_{SS}$ to $V_{WLH}$. Thereby, when the threshold voltage $Vt_{WL}$ for the "0" erasing of the second N channel MOS transistor region where the third gate conductor layer 5c connected with the word line WL1 surrounds the channel region 8 is $Vt_{WL}$"0", the voltage of each channel region 8 of the memory cells C01, C21, with the rise in the voltage of the word line WL1, becomes $V_{FB}$"0"+$\beta_{BL} \times V_{BLH}$+$\beta_{WL} \times Vt_{WL}$"0", due to the second capacitive coupling between the word line WL1 and the channel region 8, from $V_{SS}$ to $Vt_{WL}$"0". For example, $Vt_{WL}$"0" is 1.3 V. When the voltage of the word line WL1 rises to $Vt_{WL}$"0" or higher, the inversion layer 12b is formed in the channel region 8 on the inside of the third gate conductor layer 5c, and interrupts the second capacitive coupling between the word line WL1 and the channel region 8.

Next, in a period of time T3 to time T4, for example, the voltage of the first gate conductor layer 5a connected with the first plate line PL11 is raised from $V_{PL1L}$ to a high voltage $V_{PL1H}$. For example, $V_{PL1H}$ is 1.6 V. Thereby, $V_{PL1H}$ is set to a voltage equal to or higher than 1.3 V, which is the threshold voltage $Vt_{WL}$"0" for the "0" erasing. Further, a positively-biased pulse voltage (an example of the "positively-biased pulse voltage" in the claims) is applied such that the voltage of the second gate conductor layer 5b connected with the second plate line PL21 is raised from $V_{SS}$ to $V_{PL2H}$, for example. For example, $V_{PL2H}$ is 0.3 V. The threshold voltage after the "1" writing is 0.3 V, for example, and therefore, when $V_{PL2H}$ is raised to 0.3 V or higher, the inversion layer is formed also in the channel region 8 of the second gate conductor layer 5b, as the positive hole group 11 generated by the impact ionization phenomenon is hard to be accumulated in the channel region 8. Further, the voltage of the third gate conductor layer 5c connected with the word line WL1 is raised to $V_{WLH}$=1.6 V, for example. As a result, the inversion layer 12a is formed in the channel region 8 on the inside of the first conductor layer 5a connected with the first plate line PL11, and a pinch-off point 13 exists in the inversion layer 12a. Accordingly, the first N channel MOS transistor region including the first gate conductor layer 5a operates in a linear region. On the other hand, the second N channel MOS transistor region including the third gate conductor layer 5c connected with the word line WL1 operates in a saturation region. As a result, the pinch-off point does not exist in the channel region 8 on the inside of the third gate conductor layer 5c connected with the word line WL1, and the inversion layer 12b is formed on the inside of the gate conductor layer 5c. The inversion layer 12b formed on the inside of the third gate conductor layer 5c connected with the word line WL1 serves as a substantial drain for the first N channel MOS transistor region including the first gate conductor layer 5a. As a result, the electric field is maximized in the first border region of the channel region 8 between the first N channel MOS transistor region including the first gate conductor layer 5a and the second N channel MOS transistor region including the third gate conductor layer 5c, which are connected in series, and the impact ionization phenomenon occurs in the first border region. The first border region is a source-side region relative to the second N channel MOS transistor region including the third gate conductor layer 5c connected with the word line WL1, and therefore, the phenomenon is referred to as a source-side impact ionization phenomenon. By the source-side impact ionization phenomenon, electrons flow from the N+ layer 3a connected with the source line SL to the N+ layer 3b connected with the bit line. Accelerated electrons collide with lattice Si atoms, and by the kinetic energy, pairs of electrons and positive holes are generated. Some of the generated electrons flow to the first gate conductor layer 5a and the third gate conductor layer 5c, but most of the generated electrons flow to the N⁺ layer 3b connected with the bit line BL.

Next, at time T5, the second plate line PL21 decreases from $V_{PL2H}$ to $V_{SS}$. At time T5, the first plate line PL11 is in a high-voltage state of $V_{PL1H}$, and the word line WL1 is in a high-voltage state of $V_{WLH}$, so that the generation of the positive hole group 11 by the source-side impact ionization phenomenon is continued. Even if the voltage of the second plate line PL21 decreases from $V_{PL2H}$ to $V_{SS}$ at time T5, the positive hole group 11 is accumulated in the channel region 8 until T5. As a result, the threshold voltage of the first N channel MOS transistor region and the second N channel MOS transistor region starts to decrease, for example, from 1.3 V after the "0" erasing, and therefore it is possible to sufficiently perform the page writing operation without the help by the second plate line PL21.

Then, in a period of time T6 to time T7, the voltage of the word line WL1 decreases from $V_{WLH}$ to $V_{SS}$. On this occasion, although the second capacitive coupling is performed between the word line WL1 and the channel region 8, the inversion layer 12b interrupts the second capacitive coupling until the voltage $V_{WLH}$ of the word line WL1 is equal to or lower than the threshold value voltage $Vt_{WL}$"1" of the second N channel MOS transistor region when the voltage of the channel region 8 is Vb. Accordingly, the substantial capacitive coupling between the word line WL1 and the channel region 8 is performed only when the word line WL1 becomes equal to or lower than $Vt_{WL}$"1" and falls to $V_{SS}$. As a result, the voltage of the channel region 8 becomes $Vb - \beta_{WL} \times Vt_{WL}$"1". $Vt_{WL}$"1" is lower than $Vt_{WL}$"0", and $\beta_{WL} \times Vt_{WL}$"1" is small.

Next, in a period of time T8 to time T9, the bit lines BL0, BL2 decrease from $V_{BLH}$ to $V_{SS}$. Since the capacitive coupling is performed between the bit lines BL0, BL2 and the channel region 8, the "1" writing voltage $V_{FB}$"1" of the channel region 8 is finally expressed as follows.

$$V_{FB}\text{"1"} = Vb - \beta_{WL} \times Vt_{WL}\text{"1"} - \beta_{BL} \times V_{BLH} \quad (7)$$

The coupling ratio $\beta_{BL}$ between the bit lines BL0, BL2 and the channel region 8 is also small. The memory writing operation in which the "1" writing state of the channel region 8 is set as the first data holding voltage is performed, and the first data holding voltage is assigned to the logic storage data "1".

The condition of the voltages to be applied to the bit line BL, the source line SL, the word line WL, the first plate line PL1 and the second plate line PL2 and the potential of the floating body are examples for performing the writing operation, and another operation condition allowing the writing operation may be adopted.

Figure 7D:
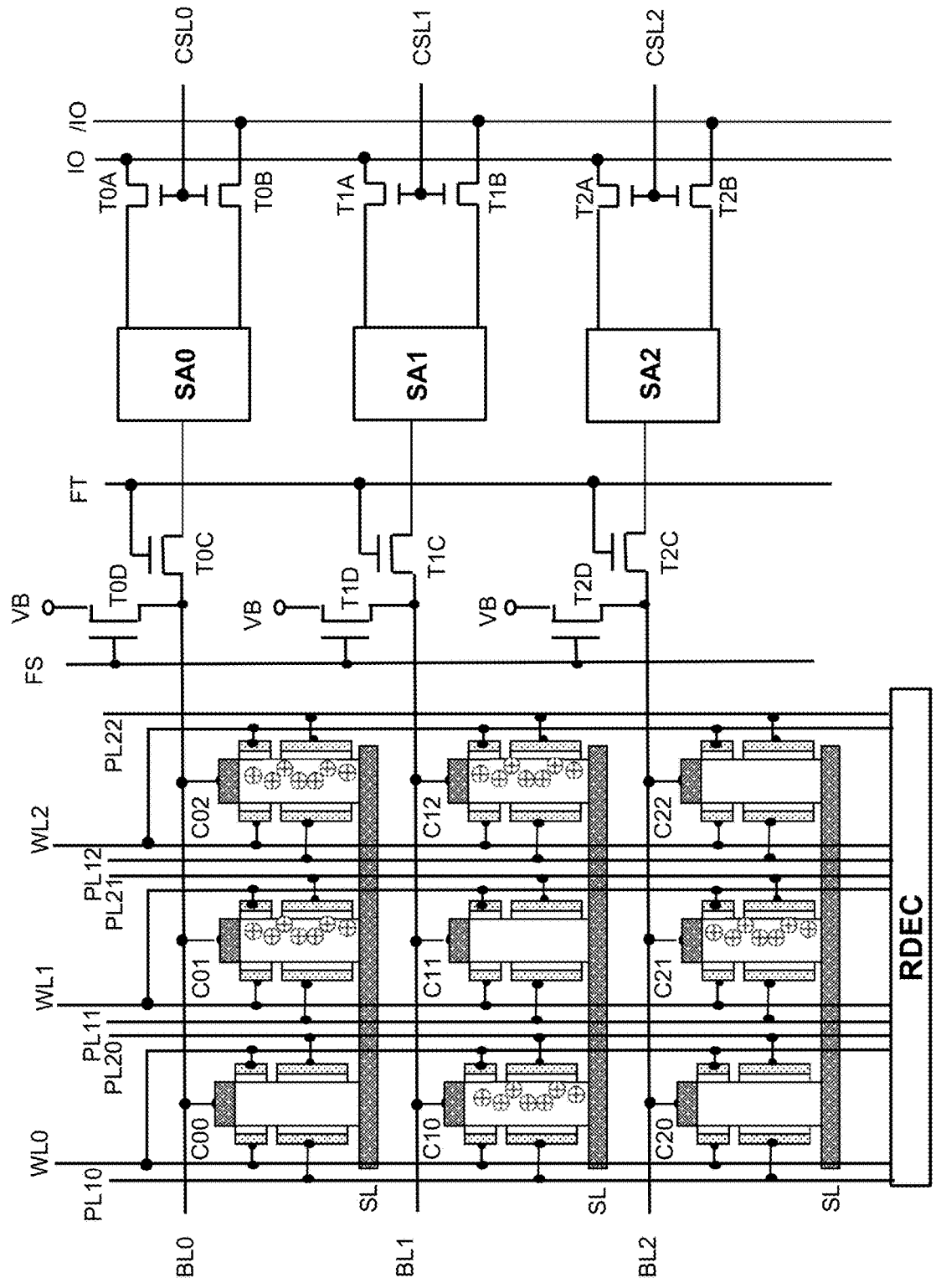
FIG. 7D is a circuit block diagram for describing the improvement of the writing operation and reading operation of the memory device including the SGT according to the first embodiment.

FIG. 7D shows a circumstance where the "1" writing is randomly performed to the memory cells C10, C01, C21, C02, C12 of the memory cells C00 to C22 at an arbitrary timing and where the positive hole group 11 is accumulated in the channel semiconductor layer 8.

Figure 7E:
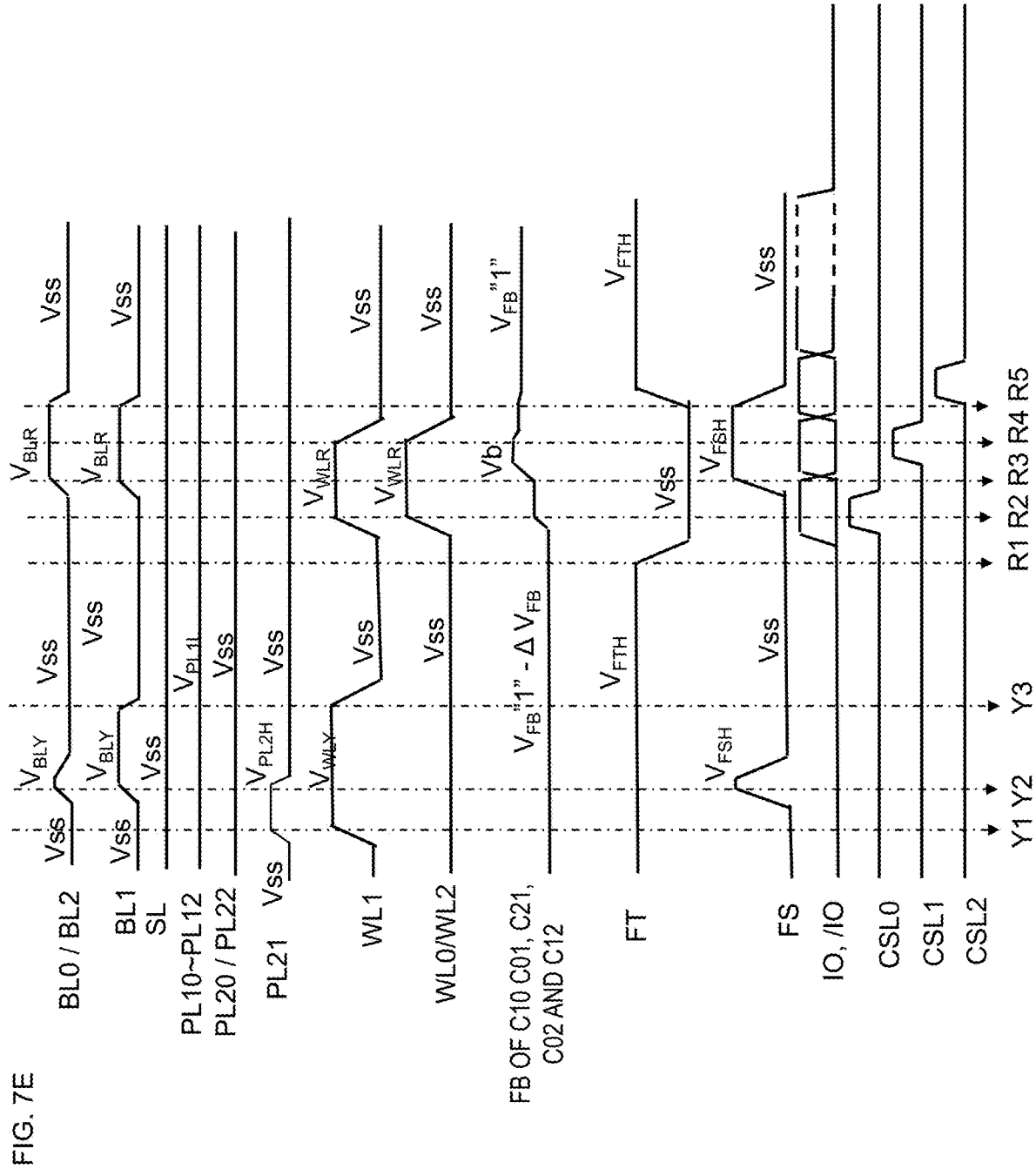
FIG. 7E is an operation waveform chart for describing the improvement of the writing operation and reading operation of the memory device including the SGT according to the first embodiment.

FIG. 7E shows the page reading operation (an example of the "page reading operation" in the claims). In a period of time Y1 to time Y3, page data (an example of the "page data" in the claims) in a memory cell group (an example of the "memory cell group" in the claims) constituted by the memory cells C01, C11, C21 that belong to a first page is read by the sense amplifier circuits SA0 to SA2. At time Y1, the voltage of the word lines WL1 connected with the first memory cell group constituted by the memory cells C01, C11, C21 rises from a low voltage $V_{SS}$ to a high voltage $V_{WLY}$ for reading, and at time Y2, the voltage of the bit lines BL0 to BL2 rises from the low voltage $V_{SS}$ to a high voltage $V_{BLY}$ for reading. For example, $V_{SS}$ may be a ground voltage $V_{SS}$=0V. Further, the voltage of the second plate line PL21 rises from the low voltage $V_{SS}$ to a high voltage $V_{PL2H}$ at time Y1, and falls from a high voltage $V_{PL2H}$ to the low voltage $V_{SS}$ at time Y2. By applying the positively-biased pulse voltage to the second plate line PL21 at the start of the page reading in this way, the memory cell current for the "1" reading increases. Furthermore, the refreshment operation that is performed in parallel with the "1" reading operation is improved. Then, at time Y3, the voltage of the word line WL1 falls from the high voltage $V_{WLY}$ for reading to the low voltage $V_{SS}$.

Figure 7F:
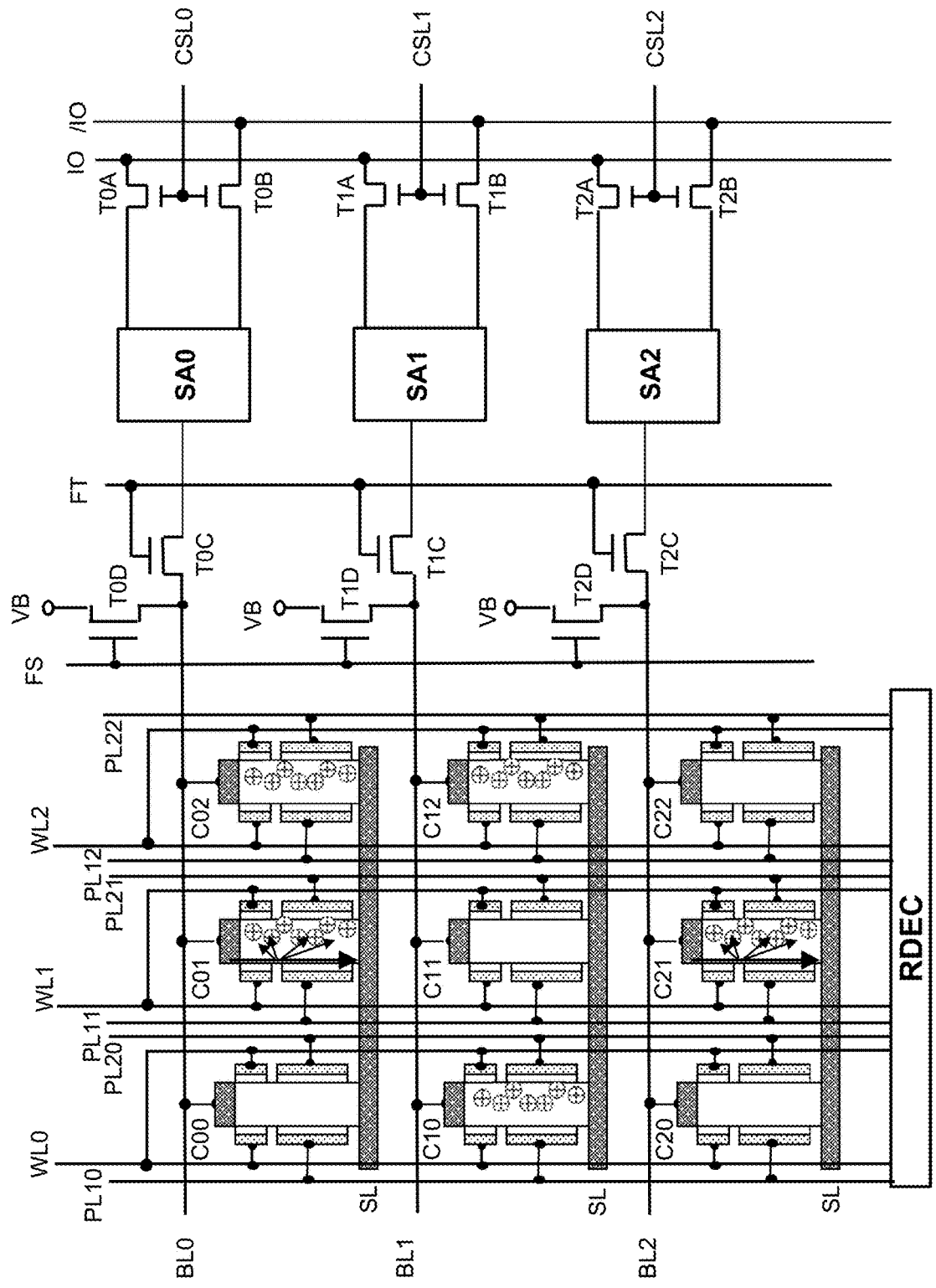
FIG. 7F is a circuit block diagram for describing the improvement of the writing operation and reading operation of the memory device including the SGT according to the first embodiment.
Figure 8A:
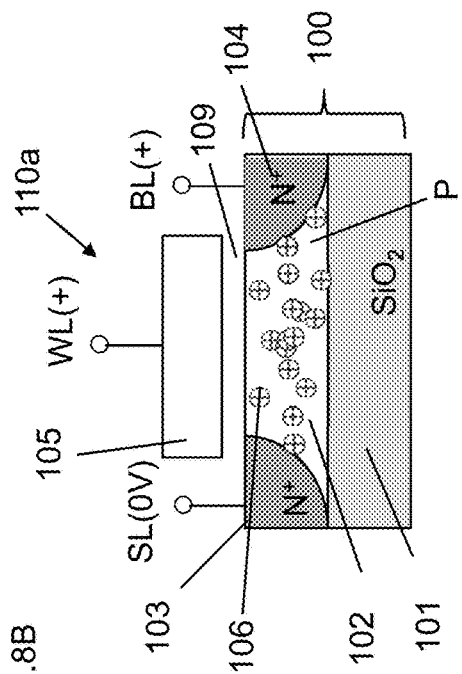
FIGS. 8A, 8B, 8C and 8D are diagrams for describing a problem about the operation of a DRAM memory cell including no capacitor in a conventional example.
Figure 8B:
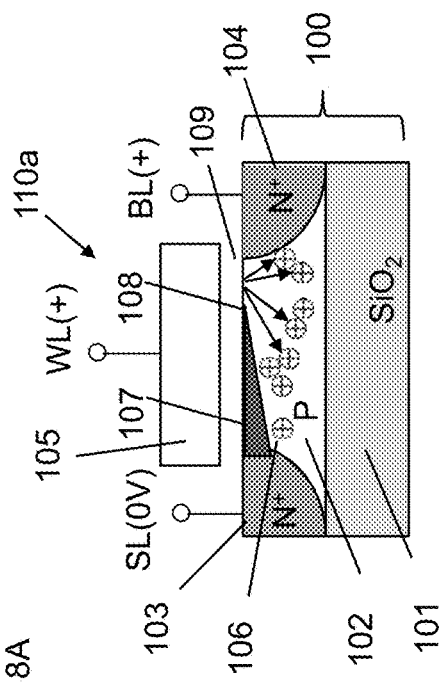
Figure 8C:
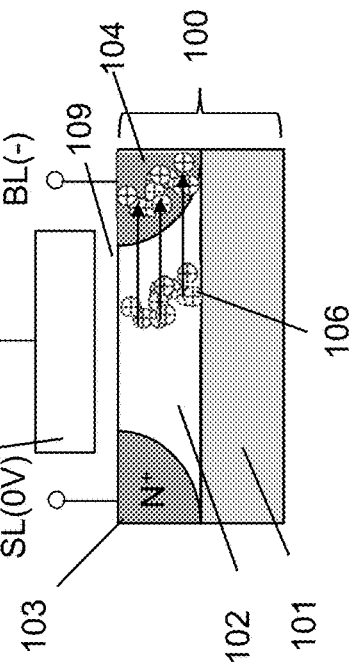
Figure 8D:
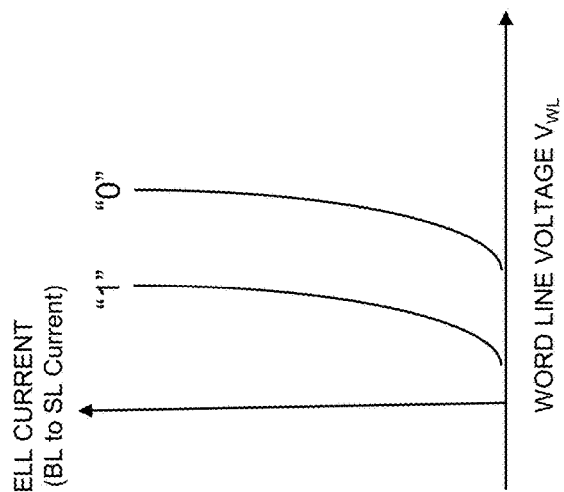
Figure 9A:
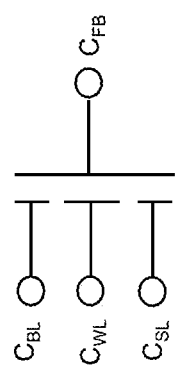
FIGS. 9A and 9B are diagrams for describing the problem about the operation of the DRAM memory cell including no capacitor in the conventional example.
Figure 9B:
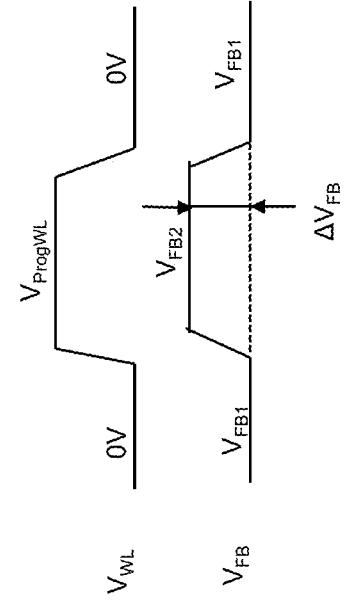
Figure 10C:
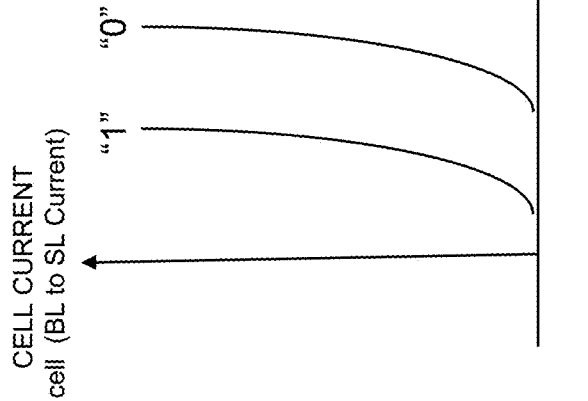
FIGS. 10A, 10B and 10C are diagrams showing a reading operation of the DRAM memory cell including no capacitor in the conventional example.
Figure 10A:
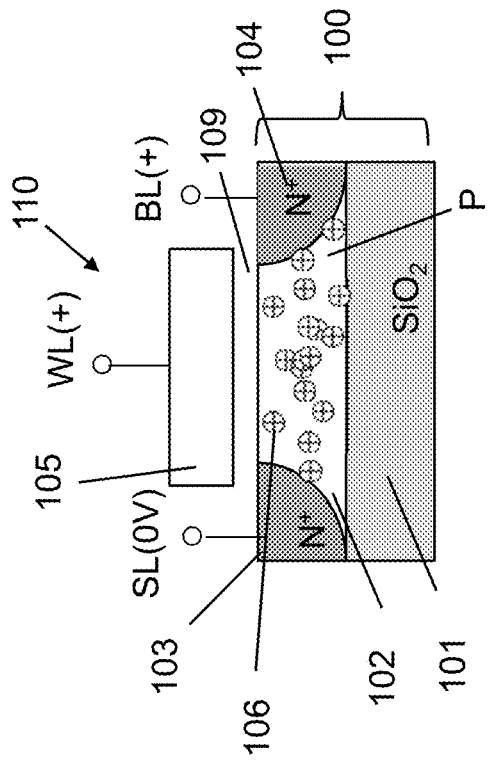
Figure 10B:
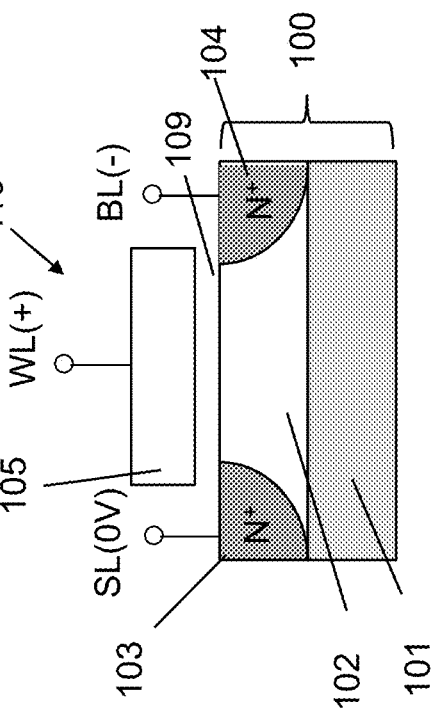

As shown in FIG. 7F, for the page data stored in the memory cell group constituted by the memory cells C01, C11, C21, in the memory cells C01, C21, the "1" writing is performed in parallel with the "1" reading operation. Accordingly, in the memory cells C01, C21, the memory cell current flows, and as a result, by the source-side impact ionization phenomenon, the positive hole group 11 is generated. That is, in the memory cells C01, C21, the refreshment operation is performed in parallel with the "1" reading.

At the time of the page reading operation, the voltage of the first plate lines PL10 to PL12 is the low voltage $V_{PL1L}$, and the voltage of the second plate lines PL20, PL22 is $V_{SS}$, which is lower than the voltage of the first plate lines PL10 to PL12. Only the voltage of the second plate line PL21 is the high voltage $V_{PL2H}$. However, $V_{PL2H}$ is lower than the low voltage $V_{PL1L}$ of the first plate lines PL10 to PL12. For example, $V_{PL1L}$ may be 0.8 V, and $V_{PL2H}$ may be 0.3 V.

Further, at time R1 in FIG. 7E, the transfer signal FT decreases from a high voltage $V_{FTH}$ to the low voltage $V_{SS}$. At time R2, all word lines WL0 to WL2 are selected, and the voltage rises from the low voltage $V_{SS}$ to the high voltage $V_{WLR}$ for refreshment. For example, the low voltage $V_{SS}$ may be 0 V, and the high voltage $V_{WLR}$ may be 1.3 V. At time R3, the bit line pre-charge signal FS rises from the low voltage $V_{SS}$ to a high voltage $V_{FSH}$, and then the voltage of the bit lines BL0 to BL2 rises from the low voltage $V_{SS}$ to a high voltage $V_{BLR}$ for refreshment. As a result, even if the positive hole group 11 in the interior of each channel semiconductor layer 8 of the memory cells C10, C01, C21, C02, C12 after the "1" writing decreases, the voltage rises to the built-in voltage Vb due to the refreshment operation. Thereafter, at time R4, all word lines WL0 to WL2 are reset, and at time R5, the bit lines BL0 to BL2 are reset. The voltage of the channel semiconductor layer 8 slightly decreases and becomes the first data holding voltage $V_{FB}$"1", due to the capacitive coupling of the word lines WL0 to WL2, the bit lines BL0 to BL2 and the channel semiconductor layer 8.

Further, the circuit block shown in FIG. 7A, FIG. 7B, FIG. 7D and FIG. 7F can output the page data that is included in the memory cell group constituted by the memory cells C01, C11, C21 and that is read by the sense amplifier circuit SA0 to SA2, to the complementary input-output lines IO,/IO, at the time of the refreshment operation in the page reading operation.

When the word line WL1 is selected at time Y1 and the bit line pre-charge signal FS rises from $V_{SS}$ to the high voltage $V_{FSH}$ at time Y2, the storage data in the memory cells C01, C11, C21 shown in FIG. 7D is read to the bit lines BL0 to BL2, respectively. During the page reading operation, the transfer signal FT is $V_{FTH}$, and the transistors T0C to T2C, each of which is a switch circuit, are in a conduction state. The sense amplifier circuits SA0 to SA2 read the storage data in the memory cells C01, C11, C21, and performs a logic determination of whether the storage data is "0" or "1". Thereafter, the refreshment operation starts. Then, the transfer signal FT decreases from $V_{FTH}$ to $V_{SS}$, and the transistors T0C to T2C, each of which is a switch circuit, becomes a non-conduction state. As a result, the bit lines BL0 to BL2 and the sense amplifier circuits SA0 to SA2 are electrically isolated from each other. The page data read from the memory cells C01, C11, C21 is stored in the sensor amplifier circuits SA0 to SA2. Next, the column selection lines CSL0 to CSL2 are sequentially input to the gates of the transistors T0A to T2B, and thereby the page data stored in the sense amplifier circuits SA0 to SA2 is output to the complementary input-output lines IO,/IO.

Further, the writing operation of the page data to the sense amplifier circuits SA0 to SA2 in the refreshment operation can be described with use of FIG. 7D. When the refreshment operation starts, the transfer signal FT decreases from $V_{FTH}$ to $V_{SS}$, and the transistors T0C to T2C, each of which is a switch circuit, become the non-conduction state. As a result, the bit lines BL0 to BL2 and the sense amplifier circuits SA0 to SA2 are electrically isolated from each other. The page data may be written to the sense amplifier circuits SA0 to SA2 from the input-output lines IO,/IO through the column selection lines CSL0 to CSL2.

Since the bit lines and the sense amplifier circuits are electrically isolated by the switch circuits T0C to T2C in this way, it is possible to freely read the page data stored in the sense amplifier circuits or write the page data in the sense amplifier circuits, at the time of the refreshment operation. Accordingly, it is possible to perform the refreshment operation, as a background operation behind the page reading operation or the page writing operation. As a result, it is possible to provide a memory device for a high-speed system.

In the circuit block shown in FIG. 7A, FIG. 7B, FIG. 7D and FIG. 7F, each of the word lines WL0 to WL2 is connected with right and left memory block ends. However, each of the word lines WL0 to WL2 may be connected with the row decoder circuit RDEC in an isolated state, and may be controlled synchronously or asynchronously.

In FIG. 1A to FIG. 1D, the dynamic flash memory operation can be performed even in a structure in which the conductive polarities of the N+ layers 3a, 3b and the P layer 2 are reversed. In this case, the "P layer 2" is an "N layer 2", and many carriers in the N layer 2 are electrons. Accordingly, an electron group generated by the impact ionization is accumulated in the channel region 8, and the "1" state is set.

In FIG. 1A to FIG. 1D, the separation between the first gate conductor layer 5a and the third gate conductor layer 5c and the separation between the second gate conductor layer 5b and the third gate conductor layer 5c are performed by the insulating layer 6. However, the second gate insulating layer 4b may be extended so as to cover the exposed P layer 2 and first gate conductor layer 5a, and the insulating separation among the first gate conductor layer 5a, the second gate conductor layer 5b and the third gate conductor layer 5c may be performed. Similarly, the first gate insulating layer 4a may be extended so as to cover the exposed P layer 2 and third gate conductor layer 5c, and the insulating separation among the first gate conductor layer 5a, the second gate conductor layer 5b and the third gate conductor layer 5c may be performed. Further, the insulating separation may be performed by another method.

In FIG. 1A to FIG. 1D, the first gate insulating layer 4a is formed so as to cover both side surfaces and the upper surface of the P layer 2. However, the first gate insulating layer 4a may be formed so as to cover at least both side surfaces of the P layer 2.

In FIG. 1A to FIG. 1D, the dynamic flash memory cell is formed in the zonal first semiconductor layer standing on the insulating substrate 1 in the direction vertical to the insulating substrate, but may be formed in a planar semiconductor layer. Further, the dynamic flash memory cell may be formed in a semiconductor layer that stands in the direction vertical to the substrate (see, Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991),which is incorporated herein by this reference) or extends in the direction horizontal to the substrate (see, N. Loubet, et al.: "Stacked Nanosheet Gate-All-Around Transistor to Enable Scaling Beyond FinFET," 2017 IEEE Symposium on VLSI Technology Digest of Technical Papers, T17-5, T230-T231, June 2017, which is incorporated herein by this reference), on the substrate.

In FIG. 1A to FIG. 1D, a P layer having a lower acceptor impurity concentration than the P layer 2 may be provided in either or both of a spot between the N+ layer 3a and the P layer 2 and a spot between the N+ layer 3b and the P layer 2. Further, an N layer having a lower donor impurity concentration than the N+ layer 3a and the N+ layer 3b may be provided in either or both of the spot between the N+ layer 3a and the P layer 2 and the spot between the N+ layer 3b and the P layer 2.

An SOI substrate may be used as the insulating substrate 1 in FIG. 1A to FIG. 1D. The insulating substrate 1 may be formed by using a semiconductor substrate, forming the P layer 2 and thereafter oxidizing a bottom portion of the P layer 2 and an upper surface of the semiconductor substrate at an outer circumference portion of the P layer 2.

Expressions (1) to (7) in the specifications and the drawings are expressions that is used for qualitatively describing phenomena, and the phenomena are not limited by the expressions.

In FIG. 7A to FIG. 7F, the refreshment operation of a one-bit dynamic flash memory cell formed from one semiconductor mother body has been described. However, the present invention is effective also for the refreshment operation of a one-bit high-speed dynamic flash memory cell formed from two semiconductor mother bodies in which complementary data of "1" and "0" is stored.

In FIG. 7A to FIG. 7F, the refreshment operation of a one-bit dynamic flash memory cell formed from one semiconductor mother body and included in a single-layer memory array has been described. However, the present invention is effective also for a multiple-layer memory array in which one-bit dynamic flash memory cells each of which is formed from one semiconductor mother body are laminated in multiple stages.

In FIG. 1A to FIG. 1D, the word line WL may be provided on the source line SL side, and the first plate line PL1 and the second plate line PL2 may be provided on the bit line BL side. Even in this case, the above-described dynamic flash memory operation can be performed.

The embodiment has the following characteristics.

(Characteristic 1)

In the conventional example shown in FIGS. 8A-8D to FIGS. 10A-10C, the "1" writing is performed by accumulating the positive hole group 106 in the floating body 102 of the P layer. The voltage of the floating body 102 greatly varies by the reading pulse voltage that is applied to the word line. There is a problem in that the positive hole group 106 accumulated by the voltage variation leaks from the floating body 102. Thereby, there is a problem in that the potential difference margin between the "1" potential and "0" potential in the floating body at the time of the writing is not sufficiently obtained. In response, as shown in the embodiment, the first gate conductor layer 5a and second gate conductor layer 5b that control the voltage of the floating body of the P layer 2 that is the channel region are provided separately from the third gate conductor layer 5c that is continuous with the first word line WL1. Thereby, it is possible to suppress the variation of the floating body voltage of the P layer 2 when the drive pulse voltage is applied to the first word line. As a result, it is possible to increase the potential difference margin between the "1" potential and "0" potential in the floating body at the time of the writing.

(Characteristic 2)

As shown in FIG. 1A to FIG. 1D, the first gate conductor layer 5a that is continuous with the first plate line and the second gate conductor layer 5b that is continuous with the second plate line are provided on both side surfaces of the P layer 2. By setting the second plate line voltage to a voltage lower than the first plate line voltage, it is possible to accumulate the positive hole group 11 generated at the time of the writing shown in FIG. 3A to FIG. 3C, in the P layer 2 close to the second gate conductor layer 5b. Then, at the time of the "1" reading, as shown in FIG. 4A to FIG. 4C, the second plate line voltage is set to a voltage lower than a reading-on voltage of the first plate line, and thereby it is possible to stably hold the positive hole group in the P layer 2 close to the second gate conductor layer 5b, in the reading operation. Thereby, a high potential difference margin is stably obtained.

(Characteristic 3)

In the page writing operation and page reading operation of the dynamic flash memory cell according to the first embodiment of the present invention, a positively-biased pulse voltage equal to or lower than the first plate line PL1 is input to the second plate line PL2. As a result, in the page writing operation, it is possible to accelerate the "1" writing to the memory cell for which the threshold voltage is high after the "0" erasing. Further, in the page reading operation, it is possible to improve the memory cell current for the "1" reading, and to considerably enhance the refreshment operation.

Other Embodiments

In FIG. 1A to FIG. 1D, the first to third gate conductor layers 5a, 5b, 5c may be used while being combined with a single-layer or multi-layer conductive material including polycrystalline Si containing a large amount of donor or acceptor impurity. Further, outsides of the first to third gate conductor layers 5a, 5b, 5c may be continuous with a wire metal layer composed of W, for example. The same goes for other embodiments.

In the first embodiment, as described above, the dynamic flash memory with a wide operation margin is obtained by setting either of the first gate capacity between the first gate conductor layer 5a and the P layer 2 and the second gate capacity between the second gate conductor layer 5b and the P layer 2 or the total capacity of both of the first gate capacity and the second gate capacity, to a capacity that is larger than the third gate capacity between the third gate conductor layer 5c and the P layer 2. This may be performed by combining the gate lengths of the first to third gate conductor layers 5a 5b, 5c and the thicknesses or dielectric constants of the first and second gate insulating layers 4a, 4b, such that either of the first and second gate capacities of the first and second gate conductor layers 5a, 5b or the total capacity of both of the first and second gate capacities is larger than the third gate capacity of the third gate conductor layer 5c. The same goes for other embodiments. In the data reading, the voltage to be applied to the first gate conductor layer 5a that is continuous with the first plate line PL1 is set to a voltage that is higher than the threshold voltage when the logic storage data is "1" and that is lower than the threshold voltage when the logic storage data is "0", and the voltage to be applied to the second gate conductor layer 5b that is continuous with the second plate line PL2 is set to 0 V, for example. Thereby, it is possible to obtain a characteristic by which electric current does not flow even if the voltage of the word line WL is high. This leads to a further increase in the operation margin of the dynamic flash memory cell.

The memory device may be formed by laminating a plurality of first dynamic flash memory cells shown in FIG. 1 in the vertical direction. The same goes for other embodiments.

The cross-sectional shape of the P layer 2 is a rectangular shape in FIG. 1A to FIG. 1D, but may be a trapezoidal shape. Further, the cross-sectional shape of the P layer may be different between the portion covered with the first gate insulating layer 4a and the portion covered with the second gate insulating layer 4b. The same goes for other embodiments.

In the description in the first embodiment, at the time of the erasing operation, the source line SL is negatively biased, and the positive hole group in the channel region 8 that is the floating body FB is removed. However, the erasing operation may be performed while the bit line BL is negatively biased instead of the source line SL, or while both of the source line SL and the bit line BL are negatively biased. Alternatively, the erasing operation may be performed by another voltage condition.

The $N^+$ layers 3a, 3b in FIG. 1A to FIG. 1D may be formed of a layer composed of Si or another semiconductor material and containing donor impurity. Further, the $N^+$ layer 3a and the $N^+$ layer 3b may be formed of different semiconductor material layers. The same goes for other embodiments.

In the present invention, various embodiments and modifications can be made without departing from the spirit and scope in the broad sense of the present invention. Further, the above-described embodiments are embodiments for describing an example of the present invention, and do not limit the scope of the present invention. The above embodiments and modifications can be arbitrarily combined. Furthermore, as necessary, embodiments in which some of the constituent elements in the above embodiments are excluded is also within the scope of the technical idea of the present invention.

With the memory device using the semiconductor element according to the present invention, it is possible to obtain a dynamic flash memory having a high densification and a high performance.

What is claimed is:

1. A memory device using a semiconductor element, the memory device including a plurality of pages arrayed in a column direction on a substrate, each of the plurality of pages being constituted by a plurality of memory cells arrayed in a row direction on the substrate, each of the plurality of memory cells included in each of the plurality of pages comprising:

a first semiconductor layer that stands in a direction vertical to the substrate or extends in a direction horizontal to the substrate, on the substrate;

a first impurity layer and a second impurity layer that are provided at both ends of the first semiconductor layer in a first direction parallel to the substrate;

a first gate insulating layer that covers both side surfaces of the first semiconductor layer close to the first impurity layer in a second direction parallel to the substrate and vertical to the first direction;

a first gate conductor layer and a second gate conductor layer that cover both side surfaces of the first gate insulating layer in planar view and that are separated from each other;

a second gate insulating layer that covers the first semiconductor layer close to the second impurity layer; and a third gate conductor layer that covers the second gate insulating layer, voltages that are applied to the first gate conductor layer, the second gate conductor layer, the third gate conductor layer, the first impurity layer and the second impurity layer being controlled to hold a positive hole group generated by an impact ionization phenomenon, in the interior of the first semiconductor layer, at the time of a page writing operation, the voltage of a channel semiconductor layer being set to a first data holding voltage higher than either or both of the first impurity layer and the second impurity layer, at the time of a page erasing operation, the voltages that are applied to the first gate conductor layer, the second gate conductor layer, the third gate conductor layer, the first impurity layer and the second impurity layer being controlled to remove the positive hole group from either or both of the first impurity layer and the second impurity layer and set the voltage of the first semiconductor layer to a second data holding voltage lower than the first holding voltage, the first impurity layer of each of the plurality of memory cells being connected with a source line, the second impurity layer being connected with a bit line, the first gate conductor layer being connected with a first plate line, the second gate conductor layer being connected with a second plate line, the third gate conductor layer being connected with a word line, the bit line being connected with a sense amplifier circuit, at the time of a page reading operation, voltages that are applied to the word line, the first plate line, the second plate line, the source line and the bit line being controlled to cause the sense amplifier circuit to read page data in a memory cell group selected by the word line, in either or both of the page writing operation and the page reading operation, a positively-biased pulse voltage equal to or lower than the voltage of the first plate line being input to the second plate line.

2. The memory device using the semiconductor element according to claim 1, wherein at the time of the page erasing operation, an identical pulse voltage, or a fixed voltage lower than that for the first plate line is input to the first plate line and the second plate line.

3. The memory device using the semiconductor element according to claim 1, wherein at the time of the page reading operation, a fixed voltage higher than the positively-biased pulse voltage for the second plate line is input to the first plate line.

4. The memory device using the semiconductor element according to claim 1, wherein at either or both of the time of the page writing operation and the time of the page reading operation, the width of the positively-biased pulse voltage for the second plate line is shorter than the width of a pulse voltage for the word line.

5. The memory device using the semiconductor element according to claim 1, wherein the third gate conductor layer is constituted by at least two gate conductor layers, each of which is operated synchronously or asynchronously.

6. The memory device using the semiconductor element according to claim 1, wherein either of a first gate capacity between the first gate conductor layer and the first semiconductor layer and a second gate capacity between the second gate conductor layer and the first semiconductor layer, or the total gate capacity of both of the first gate capacity and the second gate capacity is larger than a third gate capacity between the third gate conductor layer and the first semiconductor layer.

* * * * *